(12) United States Patent
Venkatasubramanian et al.

(10) Patent No.: US 7,997,087 B2
(45) Date of Patent: Aug. 16, 2011

(54) THIN FILM THERMOELECTRIC DEVICES FOR HOT-SPOT THERMAL MANAGEMENT IN MICROPROCESSORS AND OTHER ELECTRONICS

(76) Inventors: Rama Venkatasubramanian, Cary, NC (US); Randall G. Alley, Raleigh, NC (US); Pratima Addepalli, Cary, NC (US); Anil J. Reddy, Carrboro, NC (US); Edward P. Siivola, Raleigh, NC (US); Brooks C. O'Quinn, Mamers, NC (US); Kip D. Coonley, Durham, NC (US); John Posthill, Chapel Hill, NC (US); Thomas Colpitts, Durham, NC (US)

( * ) Notice: Subject to any disclaimer, the term of this patent is extended or adjusted under 35 U.S.C. 154(b) by 47 days.

(21) Appl. No.: 12/403,866

(22) Filed: Mar. 13, 2009

(65) Prior Publication Data
US 2009/0282852 A1 Nov. 19, 2009

Related U.S. Application Data

(62) Division of application No. 10/970,378, filed on Oct. 22, 2004, now Pat. No. 7,523,617.

(51) Int. Cl.
*F25B 21/02* (2006.01)
*F25D 23/00* (2006.01)
*F28D 15/00* (2006.01)
*H05K 7/20* (2006.01)
(52) U.S. Cl. ........ 62/3.7; 62/3.2; 62/259.2; 165/104.33; 361/718
(58) Field of Classification Search ........... 62/259.2, 62/3.7, 3.3; 165/104.33; 361/719, 704, 718, 361/702; 438/415
See application file for complete search history.

(56) References Cited

U.S. PATENT DOCUMENTS

| | | | |
|---|---|---|---|
| 2,984,696 A | 5/1961 | Shaffer |
| 3,088,989 A | 5/1963 | Lipkis |
| 3,136,134 A | 6/1964 | Smith |
| 3,296,034 A | 1/1967 | Reich |
| 3,607,444 A | 9/1971 | Debucs |
| 3,663,307 A | 5/1972 | Mole |
| 4,238,759 A | 12/1980 | Hunsperger |

(Continued)

FOREIGN PATENT DOCUMENTS
DE 36 19 27 A1 12/1987
(Continued)

OTHER PUBLICATIONS

Development of Low-Bandgap Ge and $SI_{0.07}Ge_{0.03}$ Solar Cells for Monolithic and Mechanically-Stacked Cascade Applications, Rama Venkatasubramanian et al., IEEE Photovoltaic Specialists Conference, pp. 73-78, May 1990.

(Continued)

*Primary Examiner* — Chen-Wen Jiang
(74) *Attorney, Agent, or Firm* — Myers Bigel Sibley & Sajovec

(57) ABSTRACT

A structure, system and method for controlling a temperature of a heat generating device in a solid medium, wherein heat is extracted from the medium into at least one heat extraction device, the heat extraction device dissipates heat into an environment apart from the medium by a heat sink thermally coupled to the heat extraction device; and heat from the medium is dissipated into the heat sink by a first thermal interface material thermally coupling the heat sink to the medium.

6 Claims, 20 Drawing Sheets

U.S. PATENT DOCUMENTS

| | | | |
|---|---|---|---|
| 4,279,292 A | 7/1981 | Swiatosz | |
| 4,443,650 A | 4/1984 | Takagi et al. | |
| 5,006,178 A | 4/1991 | Bijvoets | |
| 5,012,325 A | 4/1991 | Mansuria et al. | |
| 5,254,178 A | 10/1993 | Yamada et al. | |
| 5,362,983 A | 11/1994 | Yamamura et al. | |
| 5,419,780 A | 5/1995 | Suski | |
| 5,430,322 A | 7/1995 | Koyanagi et al. | |
| 5,799,496 A * | 9/1998 | Park et al. | 62/89 |
| 5,837,929 A | 11/1998 | Adelman | |
| 5,865,975 A | 2/1999 | Bishop | |
| 5,869,242 A | 2/1999 | Kamb | |
| 5,874,219 A | 2/1999 | Rava et al. | |
| 5,900,071 A | 5/1999 | Harman | |
| 5,922,988 A | 7/1999 | Nishimoto | |
| 6,060,331 A | 5/2000 | Shakouri et al. | |
| 6,060,657 A | 5/2000 | Harman | |
| 6,062,681 A | 5/2000 | Field et al. | |
| 6,071,351 A | 6/2000 | Venkatasubramanian | |
| 6,072,925 A | 6/2000 | Sakata | |
| 6,084,050 A | 7/2000 | Ooba et al. | |
| 6,094,919 A | 8/2000 | Bhatia | |
| 6,098,408 A * | 8/2000 | Levinson et al. | 62/3.2 |
| 6,154,266 A | 11/2000 | Okamoto et al. | |
| 6,154,479 A | 11/2000 | Yoshikawa et al. | |
| 6,180,351 B1 | 1/2001 | Cattell | |
| 6,196,002 B1 | 3/2001 | Newman et al. | |
| 6,271,459 B1 | 8/2001 | Yoo | |
| 6,282,907 B1 | 9/2001 | Ghoshal | |
| 6,300,150 B1 | 10/2001 | Venkatasubramanian | |
| 6,323,414 B1 | 11/2001 | Shakouri et al. | |
| 6,365,821 B1 | 4/2002 | Prasher | |
| 6,384,312 B1 | 5/2002 | Ghoshal et al. | |
| 6,403,876 B1 | 6/2002 | Ghoshal et al. | |
| 6,410,971 B1 | 6/2002 | Otey | |
| 6,412,286 B1 | 7/2002 | Park et al. | |
| 6,417,060 B2 | 7/2002 | Tavkhelidze et al. | |
| 6,424,533 B1 * | 7/2002 | Chu et al. | 361/719 |
| 6,505,468 B2 | 1/2003 | Venkatasubramanian | |
| 6,605,772 B2 | 8/2003 | Harman et al. | |
| 6,619,045 B1 | 9/2003 | Clark | |
| 6,625,991 B1 | 9/2003 | Clark | |
| 6,658,858 B1 | 12/2003 | Thompson et al. | |
| 6,662,570 B2 | 12/2003 | Venkatasubramanian | |
| 6,696,635 B2 | 2/2004 | Prasher | |
| 6,722,140 B2 | 4/2004 | Venkatasubramanian | |
| 6,733,605 B1 | 5/2004 | Lamping et al. | |
| 6,826,916 B2 | 12/2004 | Shimada | |
| 6,867,978 B2 | 3/2005 | Whittenburg et al. | |
| 7,005,320 B2 | 2/2006 | Kwon | |
| 7,005,738 B2 | 2/2006 | Zuo et al. | |
| 7,009,289 B2 | 3/2006 | Hu et al. | |
| 7,038,316 B2 | 5/2006 | Hu et al. | |
| 7,164,077 B2 | 1/2007 | Venkatasubramanian | |
| 7,235,735 B2 | 6/2007 | Venkatasubramanian et al. | |
| 2001/0052234 A1 | 12/2001 | Venkatasubramanian | |
| 2002/0053359 A1 | 5/2002 | Harman et al. | |
| 2002/0062648 A1 | 5/2002 | Ghoshal | |
| 2002/0069906 A1 | 6/2002 | Macris | |
| 2002/0071222 A1 | 6/2002 | Ghoshal | |
| 2002/0071223 A1 | 6/2002 | Ghoshal | |
| 2002/0092307 A1 | 7/2002 | Ghoshal | |
| 2002/0092557 A1 | 7/2002 | Ghoshal | |
| 2002/0095243 A1 | 7/2002 | Ghoshal | |
| 2002/0113289 A1 | 8/2002 | Cordes et al. | |
| 2002/0134419 A1 * | 9/2002 | Macris | 136/204 |
| 2002/0139123 A1 | 10/2002 | Bell | |
| 2002/0166839 A1 | 11/2002 | Ghoshal et al. | |
| 2002/0174660 A1 | 11/2002 | Venkatasubramanian | |
| 2003/0099279 A1 | 5/2003 | Venkatasubramanian et al. | |
| 2003/0100137 A1 | 5/2003 | Venkatasubramanian | |
| 2003/0111516 A1 | 6/2003 | Ghoshal | |
| 2003/0112844 A1 | 6/2003 | Cordes et al. | |
| 2003/0113950 A1 | 6/2003 | Cooper et al. | |
| 2003/0126865 A1 | 7/2003 | Venkarasubramanian | |
| 2003/0131609 A1 | 7/2003 | Venkatasubramanian | |
| 2003/0156623 A1 | 8/2003 | Cordes et al. | |
| 2003/0169798 A1 | 9/2003 | Cordes et al. | |
| 2003/0186471 A1 | 10/2003 | Shi et al. | |
| 2003/0230332 A1 | 12/2003 | Venkatasubramanian et al. | |
| 2004/0018729 A1 | 1/2004 | Ghoshal et al. | |
| 2004/0028117 A1 | 2/2004 | Cordes et al. | |
| 2004/0118129 A1 | 6/2004 | Chrysler et al. | |
| 2004/0182088 A1 | 9/2004 | Ghoshal et al. | |
| 2004/0262745 A1 | 12/2004 | Cordes et al. | |
| 2005/0150535 A1 | 7/2005 | Samavedam et al. | |
| 2005/0150536 A1 | 7/2005 | Ngai et al. | |
| 2005/0150537 A1 | 7/2005 | Ghoshal | |
| 2005/0150539 A1 | 7/2005 | Ghoshal et al. | |
| 2005/0160752 A1 | 7/2005 | Ghoshal et al. | |
| 2005/0178423 A1 | 8/2005 | Ramanathan et al. | |
| 2006/0076046 A1 | 4/2006 | Ghoshal et al. | |
| 2006/0086096 A1 | 4/2006 | Ghoshal | |
| 2006/0086118 A1 | 4/2006 | Venkatasubramanian et al. | |
| 2006/0088271 A1 | 4/2006 | Ghoshal | |
| 2006/0137359 A1 | 6/2006 | Ghoshal | |
| 2006/0137360 A1 | 6/2006 | Ghoshal | |
| 2006/0137361 A1 | 6/2006 | Ghoshal | |

FOREIGN PATENT DOCUMENTS

| | | |
|---|---|---|
| DE | 195 37 121 A1 | 4/1997 |
| DE | 101 51 072 A2 | 4/2003 |
| EP | 0 687 020 | 12/1995 |
| EP | 0 805 501 | 11/1997 |
| JP | 6-97512 | 4/1994 |
| JP | 07202094 A * | 8/1995 |
| WO | WO 79/00626 A1 | 9/1979 |
| WO | WO 80/01438 A1 | 7/1980 |
| WO | WO98/43740 | 10/1998 |
| WO | WO98/44562 | 10/1998 |
| WO | WO 00/49664 | 8/2000 |
| WO | WO 01/08800 | 2/2001 |
| WO | WO 02/45150 A1 | 6/2002 |
| WO | WO 2004/008042 A2 | 1/2004 |
| WO | WO 2005/074463 A2 | 8/2005 |

OTHER PUBLICATIONS

Fields, S., Proteomics In Genomeland, Science vol. 291 No. 5507 pp. 1221-1224, pp. 1-7, Feb. 16, 2001.

Graded-Band-GAP AlGaAs Solar Cells For AlGaAs/Ge Cascade Cells, M.L. Timmons, et al., pp. 68-72, Photovoltaic Specialists Conference, 1990.

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., IEEE Photovoltaic Specialists Conference, Oct. 1991, pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., IEEE Photovoltaic Specialists Conference, Oct. 1991, pp. 85-98.

Physical Basis and Characteristics of Light Emission From Quantized Planar Ge Structures, Rama Venkatasubramanian, International Electron Devices Meeting, 1991, pp. 429-432.

High Quality GaAs on Si Using $Si_{0.04}Ge_{0.96}$/Ge Buffer Layers, Rama Venkatasbramanian, et al., Journal of Crystal Growth 107 (1991) pp. 489-493.
The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.
Optimization of the Heteroepitaxy of Ge on GaAs for Minority-Carrier Lifetime, Rama Venkatasubramanian, et al., Journal of Crystal Growth 112 (1991) pp. 7-13, Received Aug. 9, 1990; manuscript received in final form Dec. 14, 1990.
Intrinsic Recombination and Interface Characterization in "surface-free" GaAs Structures, D.J. Wolford et al., J. Vac. Sci. Technol. B, vol. 9, No. 4, Jul./Aug. 1991, pp. 2369-2376.
Advances in the Development of an AIGaAs/GaAs Cascade Solar Cell Using a Patterned Germanium Tunnel Interconnect, Rama Venkatasubramanian et al., Solar Cells, vol. 30, pp. 345-354, 1991.
High-Quality Eutectic-Metal-Bonded AIGaAs-GaAs Thin Films on SI Substrates, Rama Venkatasubramanian et al., Appl. Phys. Lett., vol. 60, No. 7, Feb. 17, 1992, pp. 886-888.
Photoluminescence of Porous Silicon Buried Underneath Epitaxial GaP, J.C., Campbell, et al., Appl. Phys. Lett., vol. 60, No. 7, Feb. 17, 1992, pp. 889-891.
Interface-Free GaAs Structures—From Bulk to the Quantum Limit, D.J. Wolford, et al, Inst. Phys. Conf. Ser. No. 120: Chapter 9, pp. 401-406, 1991.
Properties and Use of Cycled Grown OMVPE GaAs: Zn, GaAS:Se, and GaAS:Si Layers for High-Conductance GaAS Tunnel Junctions, Rama Venkatasubramanian et al., J. Elect. Matter, vol. 21, pp. 893-899, 1992.
Thermal Characterization of $Bi_2$, $Te_3$/$Sb_2$ $Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford.edu, Journal of Applied Physics, vol. 90, No. 2, Jul. 15, 2001, pp. 763-767.
Smaller, Faster, Efficient Thermoelectric Cooling, Rama Venkatasubramanian, vol. 30, No. 41, Oct. 17, 2001 ISSN: 0300-757X, pp. 1-2.
CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.
Sneak Preview, Optical Device Transfers Data Fast, Rama Venkatasubramanian, design news Dec. 17, 2001. p. 14.
Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000-II, pp. 3091-3097.
Phonon-Blocking Electron-Transmitting Structures, Rama Venkatasubramanian et al., Research Triangle Institute, Research Triangle Park, NC, USA, 18 International Conference on Thermoelectric (1999), pp. 100-103.
Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, $18^{th}$ International Conference on Thermoelectrics (1999), pp. 675-686.
RTI Research Yields Major Advance in Thermoelectrics, Rama Venkatasubramanian et al., pp. 8-9, 1991.
RTI International, "New Thermoelectric Materials Can Keep Chips Cool Advances in Fiber Optics and in Biotechnology also are Likely" Oct. 9, 2001.
RTI International Annual Report 2001, Turning Knowledge into Practice, pp. 4-37.
Cooling Film Tempers Tiny Hot Spots, Rama Venkatasubramanian et al, Science News, No. 3, 2001, v160, i18, p. 280.
Phonon Blocking Electron Transmitting Superlattice Structures as Advanced Thin Film Thermoelectric Materials, Rama Venkatasubramanian, Research Triangle Institute, Research Triangle Park, NC, Chapter 4, Semiconductors and Semimetals, vol. 71, pp. 175-201, 2001.
Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.
Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol. 66, No. 11, Dec. 1, 1989, pp. 5662-5664.
Radiative Recombination in Surface free $n^+In$ $In^+GaAs$ Homostructures, L.M. Smith and D.J. Wolford et al., Appl. Phys. Lett., vol. 57, No. 15, Oct. 8, 1990, pp. 1572-1574.
Measurement of AI/GaAs/AIGaAs Interface Recombination Velocities Using Time-Resolved Photoluminescence, M.L. Timmons, et al., Appl. Phys. Lett. vol. 56, No. 19, May 7, 1990, pp. 1850-1852.
Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pp. 597-602.
Venkatasubramanian et al.; "Thin-film thermoelectric devices with high room0temperature figures of merit"; XP-001090991, Nature vol. 413 (Oct. 11, 2001) pp. 597-602.
In-situ Monitoring of the Growth of $Bi_2$ $Te_3$ and $Sb_2$ $Te_3$ Superlattice Using Spectroscopic Ellipsometry Hao Cui et al. Journal of Electronic Materials, vol. 30, No. 11 2001, Special Issue Paper, pp. 1376-1381.
Incorporation Processes in MBE Growth of ZnSe, Rama Venkatasubramanian et al., Journal of Crystal Growth 95 (1989) pp. 533-537.
An Inverted-Growth Approach to Development of an IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.
15.8%-Efficient (1-SUN, AM 1.5G) GaAs Solar Cell on Optical-Grade Polycrystalline Ge Substrate, Rama Venkatasubramanian et al., Photovoltaic Specialists Conference, pp. 691-695, 1993.
Development of 20% Efficient GainAsP Solar Cells, P.R. Sharps, et. al., 1993 IEEE pp. 633-638.
Development of High-Efficiency $Al_{0.2}Ga_{0.8}As$ Solar Cells and Interconnect Schemes For $Al_{0.2}Ga_{0.3}As$/Si Mechanically-Stacked Cascade Cells, Rama Venkatasubramanian, et al., 1993 IEEE pp. 752-756.
Photoreflectance Characterization of InP and GaAs Solar Cells, R.G. Rodrigues et al., 1993 IEEE pp. 681-685.
Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.
GaAs and $Al_{0.2}Ga_{0.8}As$ Solar Cells With An Indirect-Bandgap $Al_{0.8}Ga_{0.2}As$ Emitter— Heterojunction Cells, Rama Venkatasubramanian et al., Research Triangle Institute, RTP, NC 27709, H. Field and K. Emery, National Renewable Energy Laboratory (NREL), Golden, CO 80401, First WCPEC: Dec. 5-9, 1994; Hawaii, pp. 1839-1842.
The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.
Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.
Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.
Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.

High-Efficiency Tandem Solar Cells on Single-and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al., Solid-State Electronics vol. 37, No. 11, pp. 1809-1815, 1994.

Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.

18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.

Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, 15th International Conference on Thermoelectrics (1996), IEEE pp. 454-458.

Thermal Conductivity of Si-Ge Superlattices, S.-M. Lee and David G. Cahill[a], Rama Venkatasubramanian, Appl. Phys. Lett. vol. 70, No. 22, Jun. 2, 1997, pp. 2957-2959.

20% (AM1.5) Efficiency GaAs Solar Cells on Sub-mm Grain-Size Poly-Ge and Its Transition to Low-Cost Substrates, Rama Venkatasubramanian et al., 26th PVSC: Sep. 30-Oct. 3, 1997; Anaheim, CA 1997 IEEE, pp. 811-814.

Electronic and Mechanical Properties of Ge Films Grown on Glass Substrates, R.K. Ahrenkiel et al., 26th PVSC; Sep. 30-Oct. 3, 1997; Anaheim, CA, pp. 527-529.

MOCVD of $Bi_2Te_3$ and Their Superlattice Structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 n10 p. 152(2), pp. 1-3.

ONR Contributes to Thermoelectric Research (Office of Naval Research) (Brief Article), Ozone Depletion Network Online Today, Contact ONR, website http://www.onr.navy.mil., Nov. 2001.

In-Plane Thermoelectric Properties of Freestanding Si/Ge Superlattice Structures, Rama Venkatasubramanian et al., 17th International Conference on Thermoelectrics (1998), pp. 191-197.

Potential of Si-based Superlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian, [a], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, HAO CUI, [1]I.B. BHAT[1,3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, Apr. 6, 2001, website http://www.rti.org/units/es.cfm, pp. 1-2.

Nature Publishing Group, Materials Update, Cool Future for Semiconductors, Oct. 11, 2001. pp. 1-3.

Cool New Film, Science Update, Oct. 11, 2001, http://www.nature.com/nsu/011011/011011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNP Features Item/0.260 . . . Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2dO2e882565bf006c2459/27e74866ea . . . , Jun. 20, 2002, pp. 1-3.

Nanostructured Superlattice Thin-Film Thermoelectric Devices; Nanotechnology and the Environment Applications and Implications; American Chemical Society (2005) (ACS Symposium Series 890) Chapter 47, pp. 347-352.

Grove issues power warning at IEDM lunch; David Lammers (Dec. 10, 2002) http://www.eetimes.com/showArticle.jhtml?articleID=10806530,; EETIMES online.

Superlattice Thin-film Thermoelectric Materials and Devices; Rama Venkatasubramanian et al.; Mat. Res. Soc. Symp. Proc. vol. 793 (2004 Materials Research Society) pp. 51-58.

Peltier Cooling and the Thermoelectric Figure of Merit; G.S. Nolas et al.; Thermo-electrics Basic Principles and New Materials Developments; Chapter 1.3, pp. 8-13, 2001.

International Search Report and Written Opinion for PCT/US2005/034574; Aug. 28, 2007.

International Search Report for PCT/US2005/034574 dated Jun. 6, 2007.

Zhang et al.; "High Speed Localized Cooling Using SiGe Superlattice Microrefrigerators"; 19th IEEE (2003) Semi-Therm Symposium pp. 61-65.

Shakouri et al; "On-Chip Solid-State Cooling for Integrated Circuits Using Thin-Film Microrefrigerators"; XP-002428271, IEEE Transactions on Components and Packaging Technologies, vol. 28, No. 1, Mar. 2005, pp. 65-69.

Supplementary Partial European Search Report, Application No. EP 02 72 5575 (Apr. 4, 2006).

International Search Report and Written Opinion for PCT/US2006/014377; date of mailing Jan. 12, 2007.

Reddy et al. "Measurement and Analysis of Power Conversion Efficiency in Thin-Film and Segmented Thermoelectric Devices" *Thermoelectrics*, ICT 2005, 24th International Conference pp. 72-75 (2005).

US 6,381,965, 05/2002, Ghoshal (withdrawn)

* cited by examiner

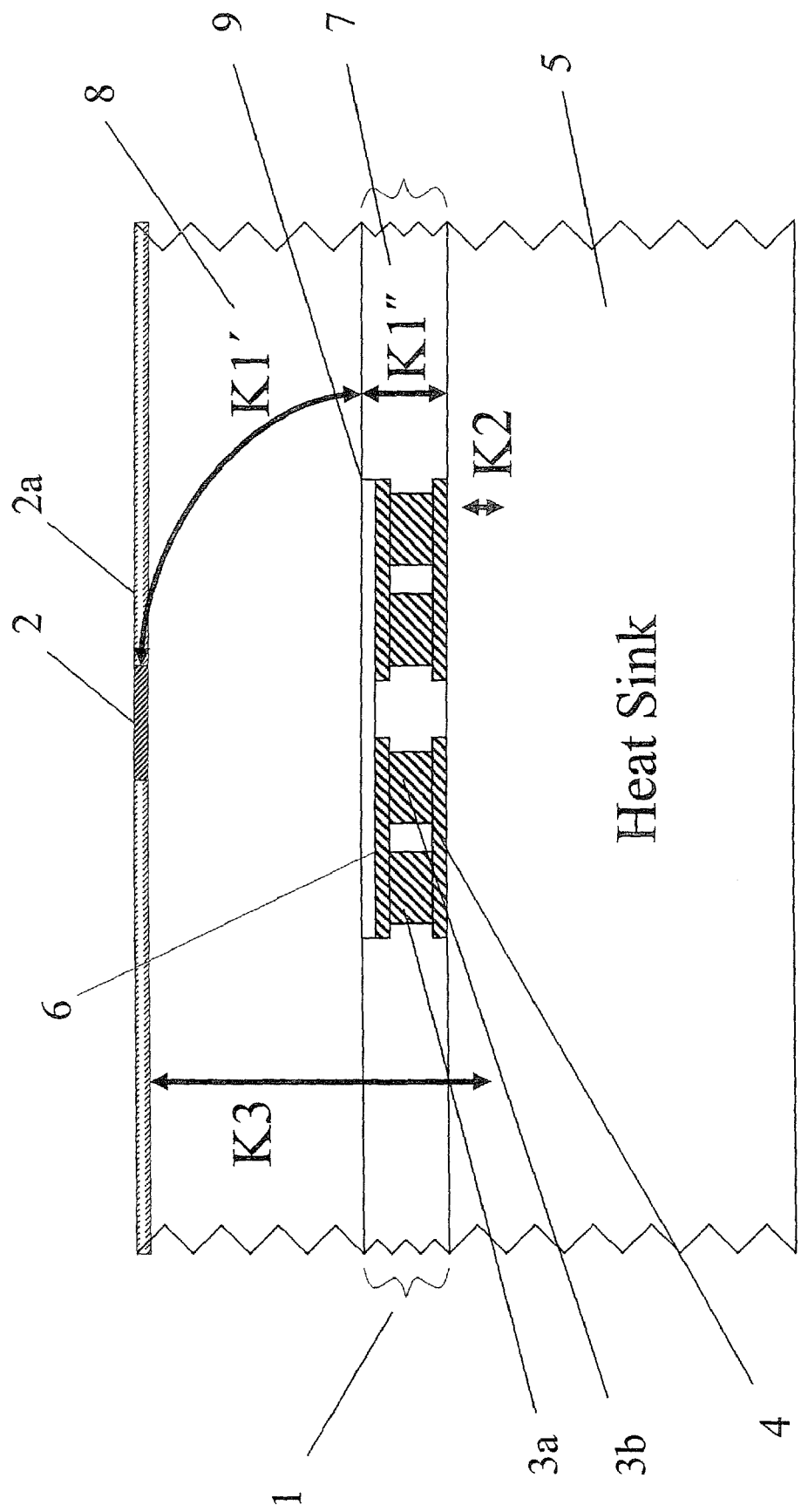

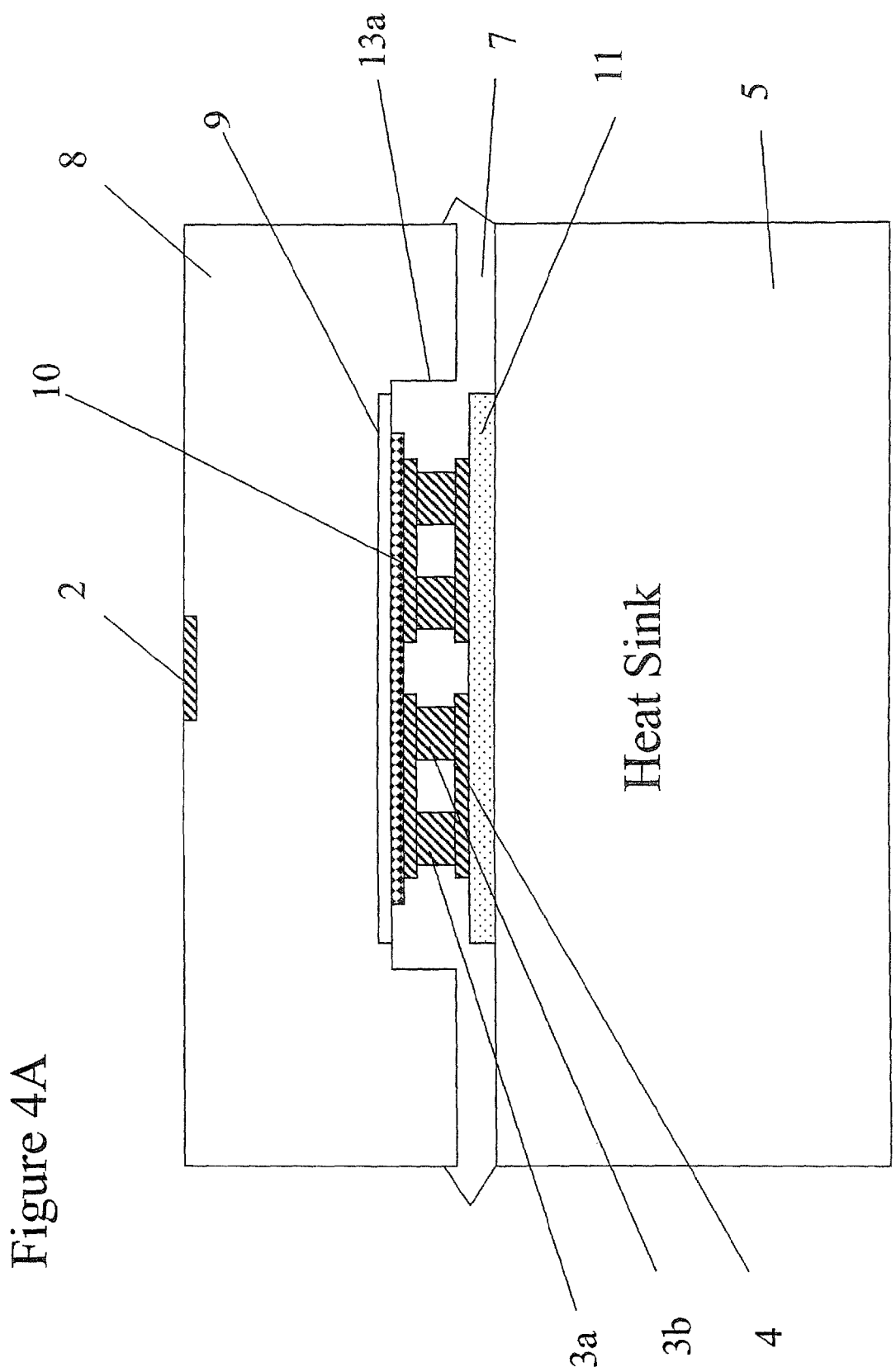

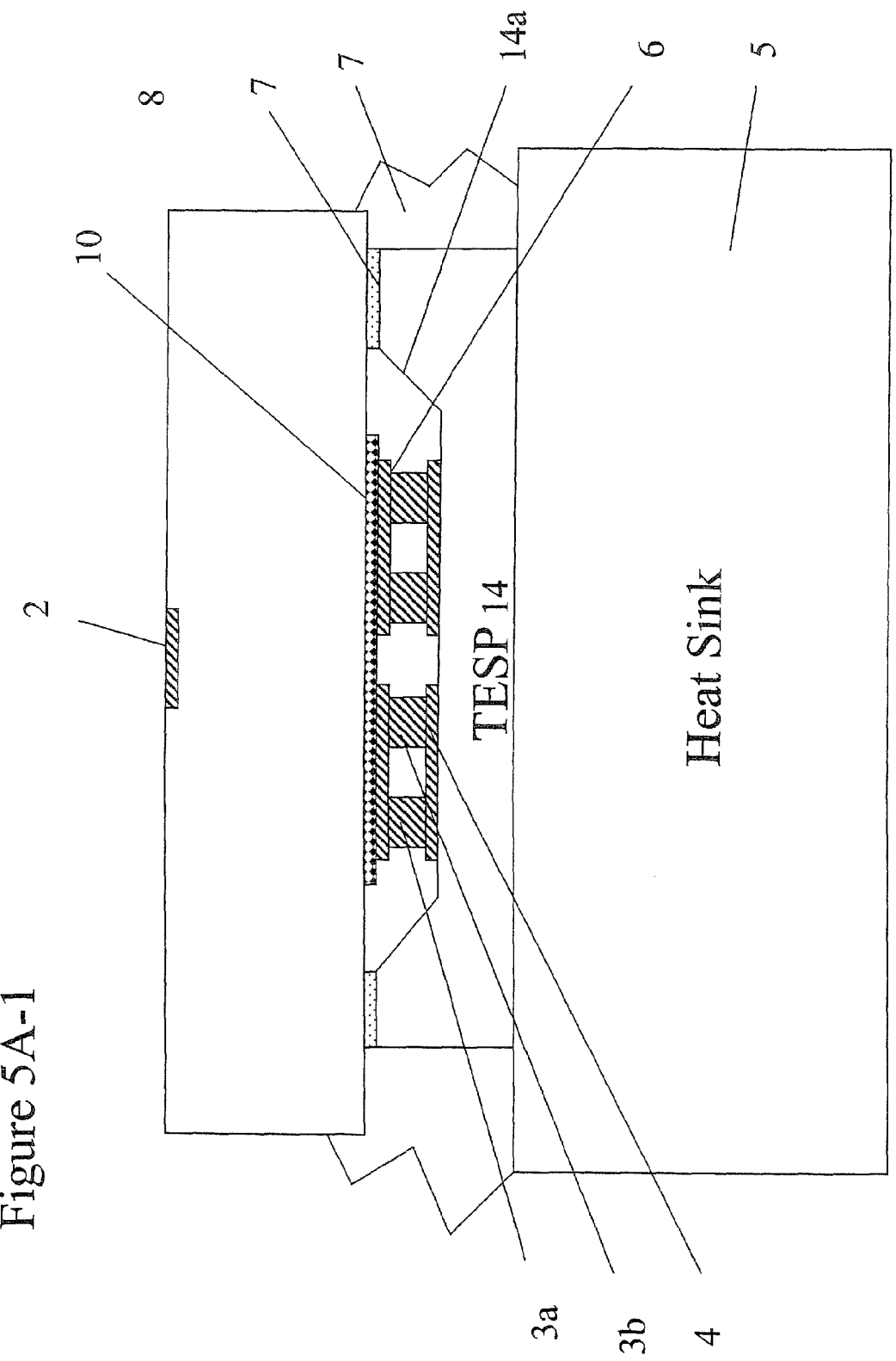

| Structure and Comments on Measurement | Configuration | Best Observed ZT | Typical ZT | Potential ZT |
|---|---|---|---|---|
| P-Type Element with two contacts | | >3.5 | 2.5 to 3.0 | 3.5 to 4.0 |
| N-Type Element with two contacts | | 2.0 | 1.0 to 1.5 | 2.0 to 2.5 |
| Invented P-N Couple one interconnect (adiabatic conditions tough but exact thermal-electrical matching between two legs not required to maximize ZT observed) | | 2.0 | 1.2 to 1.8 | 2.0 to 2.5 | to FIG. 7B

FIG. 7A

| FIG. 7A |
|---|
| FIG. 7B |

FIG. 7 from FIG. 7A

| | | | | |
|---|---|---|---|---|
| Mini-module: Flipped, Inverted P-N Couple with one interconnect and two leads with one interconnect and two leads on bottom header (adiabatic conditions difficult plus exact thermal-electrical matching between two legs needed to maximize ZT observed by Harman method) | 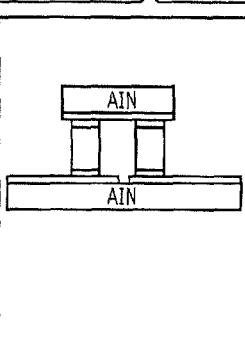 | ~1.6 (limited by lead resistances on the bottom header) | ~1.8 (limited by lead resistances on the bottom header) | >2.0 |
| Mini-module: Flipped, Inverted P-N Couple with one interconnect and two leads on bottom header (power mode where ZT is exacted from electrical power and heat flow through SL elements; no need for adiabaticity and thermal matching of legs less stringent (as one leg does not pump on other as in cooling mode when mismatched) | 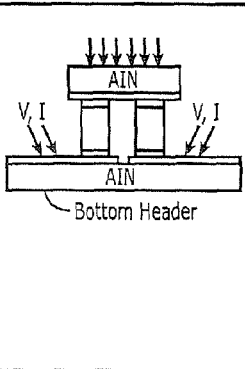 | ~1.6 (limited by lead resistances on the bottom header) | ~1.6 (limited by lead resistances on the bottom header) | >2.0 |

FIG. 7B

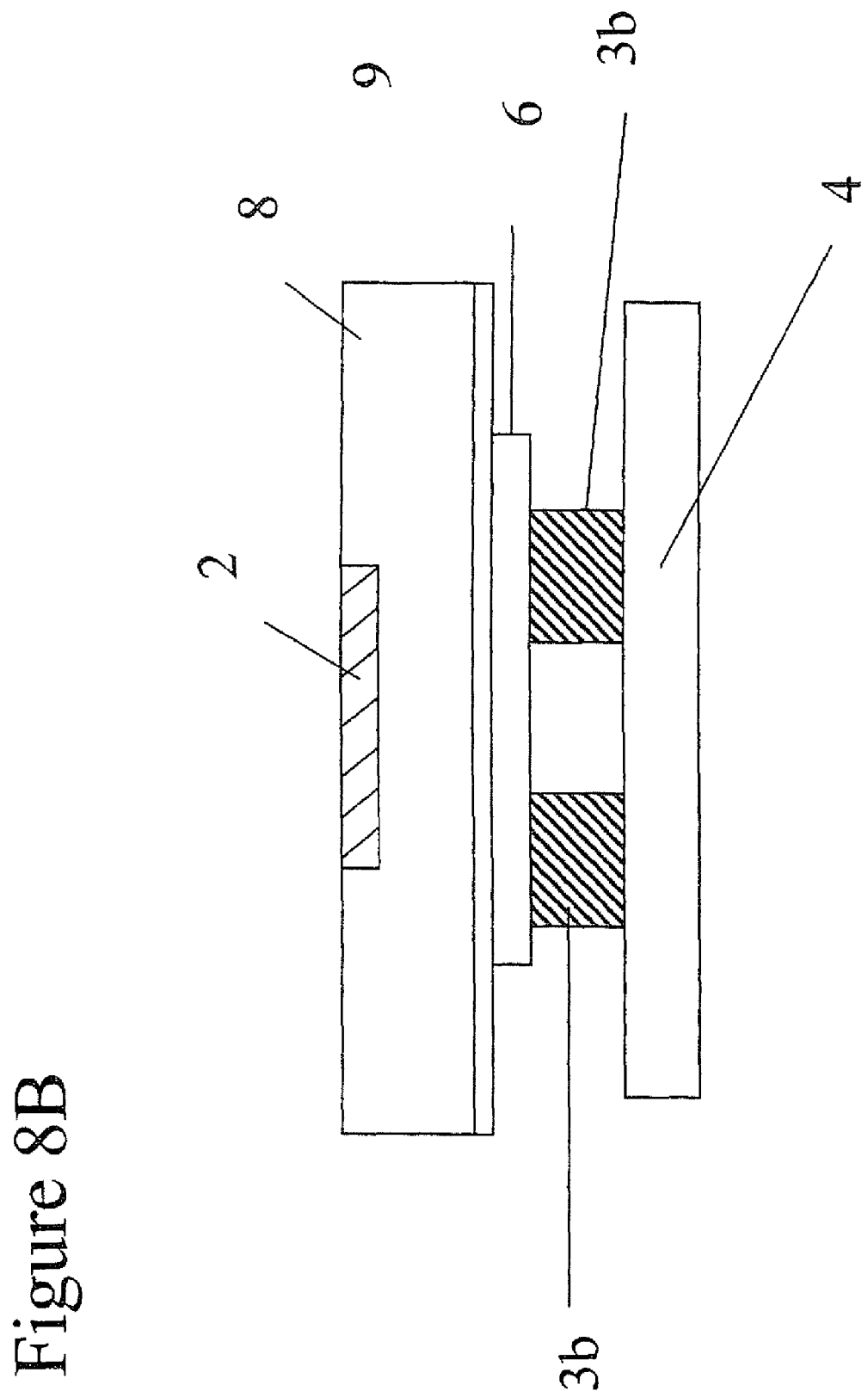

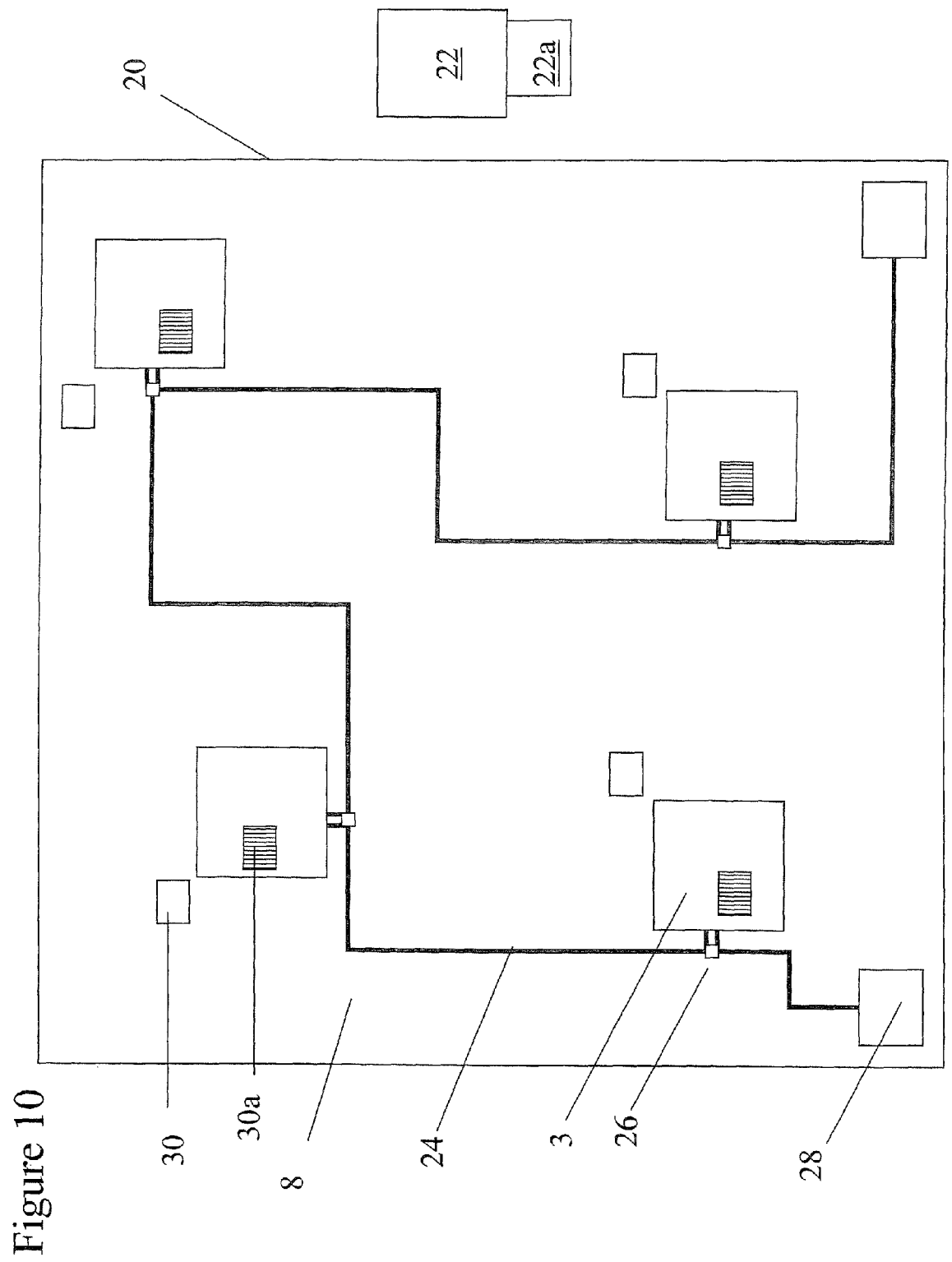

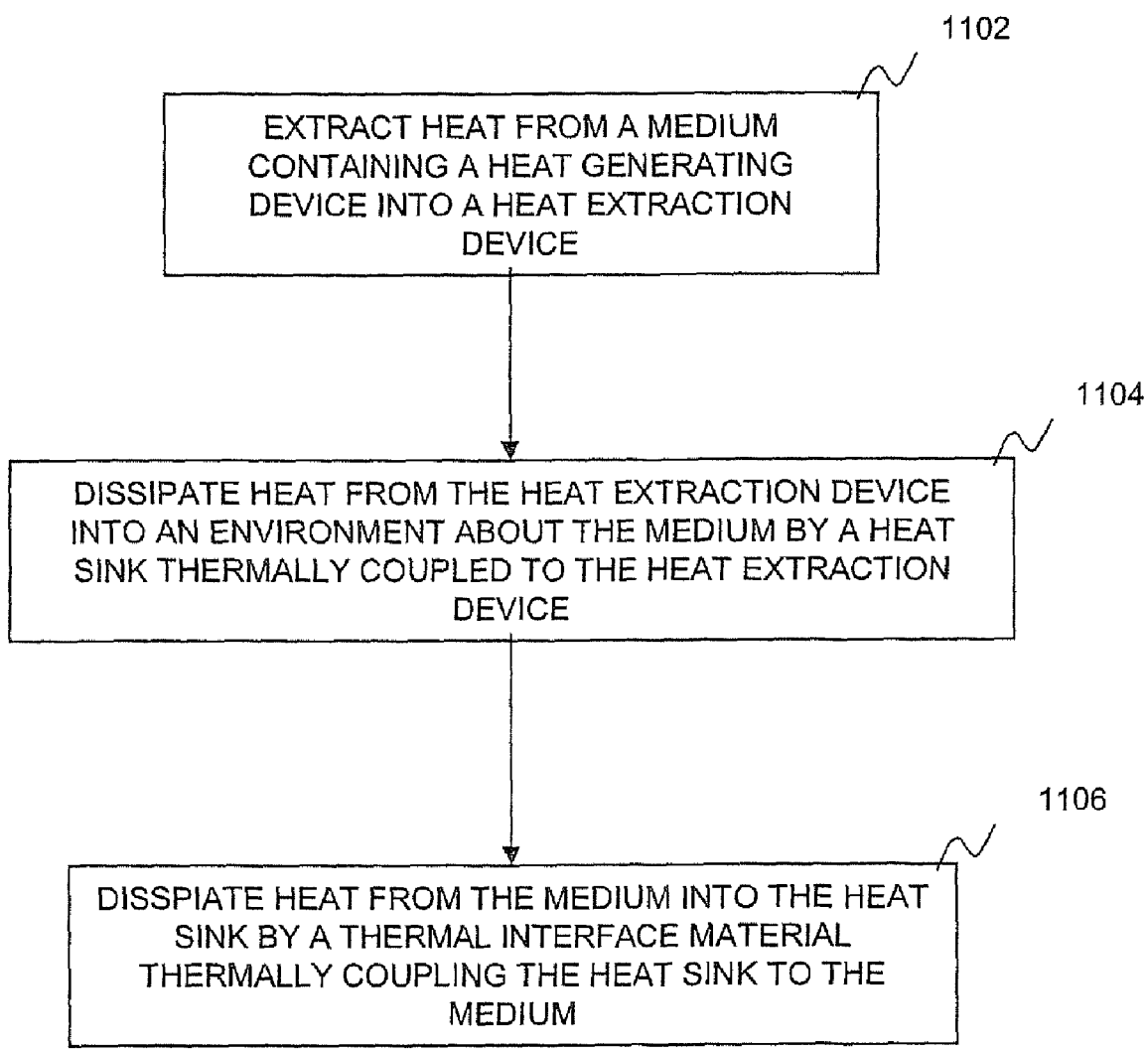

THIN FILM THERMOELECTRIC DEVICES FOR HOT-SPOT THERMAL MANAGEMENT IN MICROPROCESSORS AND OTHER ELECTRONICS

CROSS-REFERENCE TO RELATED DOCUMENTS

The present application claims the benefit of priority as a divisional of U.S. application Ser. No. 10/970,378, entitled "Thin Film Thermoelectric Devices for Hot-Spot Thermal Management in Microprocessors and Other Electronics", filed Oct. 22, 2004 now U.S. Pat. No. 7,523,617. The disclosure of the above referenced patent application is hereby incorporated herein by reference in its entirety. This application is related to U.S. Provisional Application No. 60/372,139 entitled "Thermoelectric device technology utilizing double-sided Peltier junctions" filed on Apr. 15, 2002, the entire contents of which is incorporated herein by reference. This application is related to U.S. Pat. No. 6,300,150 entitled "Thin-film thermoelectric device and fabrication method of same" issued Oct. 9, 2001, the entire contents of which is incorporated herein by reference. This application is related to U.S. Pat. No. 6,071,351 entitled "Low temperature chemical vapor depositor and etching apparatus and method" issued Jun. 6, 2002, the entire contents of which is incorporated herein by reference. This application is related to U.S. Pat. No. 6,505,468 entitled "Cascade cryogenic thermoelectric cooler for cryogenic and room temperature applications" issued Jan. 14, 2003, the entire contents of which is incorporated herein by reference. This application is also related to U.S. Provisional Application No. 60/253,743 entitled "Spontaneous emission enhanced heat transport method and structures for cooling, sensing, and power generation", filed Nov. 29, 2000, the entire contents of which is incorporated herein by reference, and subsequently filed as PCT Application No. PCT/US01/44517 filed Nov. 29, 2001. This application is related to U.S. Provisional Application No. 60/428,753, "Three-Thermal-Terminal ($T^3$) Trans-Thermoelectric Device", filed Nov. 25, 2002, the entire contents of which is incorporated herein by reference. This application is related to U.S. Provisional Application No. 60/528,479, "Thin Film Thermoelectric Devices for Power Conversion and Cooling", filed Dec. 11, 2003, the entire contents of which is incorporated herein by reference. This application is related to U.S. Ser. No. 10/265,409, "Phonon-Blocking Electron-Transmitting Low-Dimensional Structures", filed Oct. 7, 2002, the entire contents of which is incorporated herein by reference.

STATEMENT REGARDING FEDERALLY SPONSORED RESEARCH

The U.S. Government, by the following contracts, may have a paid-up license in this invention and the right in limited circumstances to require the patent owner to license others on reasonable terms, as provided for by the terms in High-Performance Thin-film Thermoelectric Devices for Cooling and Power Generation, DARPA/ONR Contract No. N00014-97-C-0211, Thin-film Thermoelectric Palm Power Technologies, DARPA/ARO Contract No. DAAD19-01-C-0070, and Meta-Material Structures for Super-Radiant Structures, DARPA/AFOSR Contract No. F49620-01-C-0038.

DISCUSSION OF THE BACKGROUND

1. Field of the Invention

This invention relates to thermoelectric devices for thermal management of microprocessor and other high power density chips.

2. Background of the Invention

A thermoelectric device can produce electrical energy when heat flows through opposite conductivity types of a thermoelectric material. Further, a thermoelectric device can cool an attached object when a current is flown in an appropriate direction through the thermoelectric material. Due to increases in the dimensionless thermoelectric figure of merit (ZT) in thermoelectric materials, both cooling and power conversion applications are possible with emerging thermoelectric technologies, such as for example the technologies described in the above-noted related applications.

One area attractive for thermoelectric application is in thermal management of integrated circuit chips. Advances in integrated circuit technology have led to faster clock frequencies and greater densities of transistors. These advances have resulted in a corresponding increase in the amount of heat generated by the integrated circuits (ICs). With large amounts of heat being generated, the problem of efficient heat dissipation has become more acute. Further, the increased density of chips produces problems due to local heating and thermally induced stress which can deteriorate chip performance and longevity. Also, cooling of transistor devices can lead to reduction of leakage currents, commonly referred to as $I_{off}$ in a CMOS device, which can in turn reduce the power consumed. In addition to heating problems with high-density circuits, supplying power to the enormous number of devices as well as power management are also becoming major issues. Thus, cooling with high-performance TE technology can potentially solve both the thermal management as well as power management problems.

A thermoelectric cooler can address these issues, for example, by removing heat from regions in the die (i.e., a medium) where heat dissipation is the highest. The thermoelectric device can be seen as a cooling device in which the cooling medium consists of electrons being electrically directed from the regions of heat generation to more remote regions where the heat contained in the electrons is dissipated. One advantage of a thermoelectric cooler in this application is that it does not require that fluids, such as for example as would be required with a heat pipe or a freon cooler, be integrated into the chip platform. Further, a thermoelectric device pumps heat to a region where more effective "passive" dissipation of heat into the environment around the chip platform is possible. More specifically, the heat is pumped to the hot side of the thermoelectric device which is in more intimate contact with the heat dissipating medium than the original heat generating region. Indeed, it is well known that passive cooling devices have a limited capacity to dissipate heat unless the passive cooling devices use microchannels which in turn require high fluid pressures Thermoelectric coolers have been used to lower the operating temperature of semiconductor devices such as lasers. Conventionally, TE coolers have been developed separately from the integrated circuit device. The importance of developing TE coolers for semiconductor devices is evidenced by the extensive technological development directed to the subject, as seen in recent patent literature. U.S. Pat. No. 4,238,759, the entire contents of which are incorporated herein by reference, describes a Peltier device that cools an adjacent P-N junction. The Peltier junction is located a few microns from the lasing junction in this device. U.S. Pat. No. 4,279,292, the entire contents of which are incorporated herein by reference, describes a TE cooler in contact with a thermal heat sink that is in turn thermally connected to a charge coupled device. U.S. Pat. No. 5,012,325, the entire contents of which are incorporated herein by reference, describes a TE IC package in which the metallizations of the IC constitute Peltier coolers. U.S. Pat. No. 5,362,983, the entire contents of which are incorporated herein by reference, describes a TE cooling module formed with ceramic substrate supports for the TE elements. U.S. Pat. No. 5,419,780, the entire contents of which are incorporated herein by reference, describes a Peltier cooler directly contacting an IC that is connected to a heat sink having a fan for additional cooling.

Yet, these approaches are limited in their performance due to the thermoelectric material characteristics of the thermo-elements in the TE devices by the profile of the devices such that the thermoelectric devices provided only limited cooling power densities (such as 1 to 2 $W/cm^2$) compared to the present invention which can provide cooling power densities in the range of 10 to 1000 $W/cm^2$, by the system design which attempted to adapt a macroscopic TE technology to cool microscopic IC devices, or by the lack of the HAF-LIOF concepts that were discussed in the U.S. Provisional Application No. 60/528,479.

SUMMARY OF THE INVENTION

One object of the present invention is to provide a thermoelectric device structure and method in which thermoelectric devices are integrated onto the device chip structure in order to cool the heat-dissipating integrated circuit devices.

Another object of the present invention is to utilize a thermoelectric device structure in which the thermoelectric properties of the device are not contravened by inadvertent heat flux from the hot side of the integrated thermoelectric device to the heat-dissipating integrated circuit device.

Still another object of the present invention is to provide a thermoelectric device in which high ZT thermoelectric materials are used to improve the efficiency of the thermoelectric device and thus reduce the total heat load dissipated from the integrated circuit device to the outside environment.

Another object of the present invention is to provide a thermoelectric device structure and method in which the operating temperature of a heat-dissipating integrated circuit device coupled thereto is reduced from where the temperature would be had the heat-dissipating integrated circuit device merely been directly coupled to a passive heat-spreader.

Various of these and other objects of the present invention are accomplished in one aspect of the present invention in which a structure for controlling a temperature of a heat generating device in a solid medium includes a heat extraction device thermally coupled to the medium and configured to extract heat from the medium. The structure includes a heat sink thermally coupled to the heat extraction device. The heat sink is configured to dissipate heat from the heat extraction device into an environment apart from the medium. The structure includes a first thermal interface material thermally coupling the heat sink to the medium.

In another aspect of the present invention, there is provided a system for controlling temperatures on a semiconductor chip. The system includes plural thermoelectric devices thermally coupled to the semiconductor chip and configured to extract heat from heat-generating circuits of the semiconductor chip. The system includes a heat sink thermally coupled to the thermoelectric devices and configured to dissipate heat from the thermoelectric devices into an environment apart from the semiconductor chip. At least one controller of the system is configured to control a current through the thermoelectric devices such that the thermoelectric devices operate in at least one of a cooling mode, a heat pump mode, a power conversion mode, and a heat flux sensing mode.

In still another aspect of the present invention, there is provided a method for controlling a temperature of a heat generating device in a solid medium. The method extracts heat from the medium into a heat extraction device, dissipates heat from the heat extraction device into an environment apart from the medium by a heat sink thermally coupled to the heat extraction device, and dissipates heat from the medium into the heat sink by a first thermal interface material thermally coupling the heat sink to the medium.

BRIEF DESCRIPTION OF THE DRAWINGS

The patent or application file contains at least one drawing executed in color. Copies of this patent or patent application publication with color drawing(s) will be provided by the Office upon request and payment of the necessary fee. A more complete appreciation of the present invention and many attendant advantages thereof will be readily obtained as the same becomes better understood by reference to the following detailed description when considered in connection with the accompanying drawings, wherein:

FIG. 4A-1 is a schematic of a thermoelectric device structure according to the present invention in which a thermoelectric device is embedded in a recess of a composite semiconductor material;

FIG. 5A-1 is a schematic of a thermoelectric device structure according to the present invention including a thermoelectric device incorporated on a tapered thermoelectric support plate of the present invention;

FIGS. 7A and 7B are schematic depicting a table showing the sequential formation of a thermoelectric device of the present invention onto a semiconductor device chip.

FIGS. 8A-8B are schematics depicting the bonding of a thermoelectric device structure of the present invention to a chip die;

FIG. 10 is a schematic representation of distributed set of thermoelectric coolers on a microprocessor chip;

FIG. 11 is a flow chart depicting one method of the present invention; and

DETAILED DESCRIPTION OF THE PREFERRED EMBODIMENTS

Figures 1, 4A:
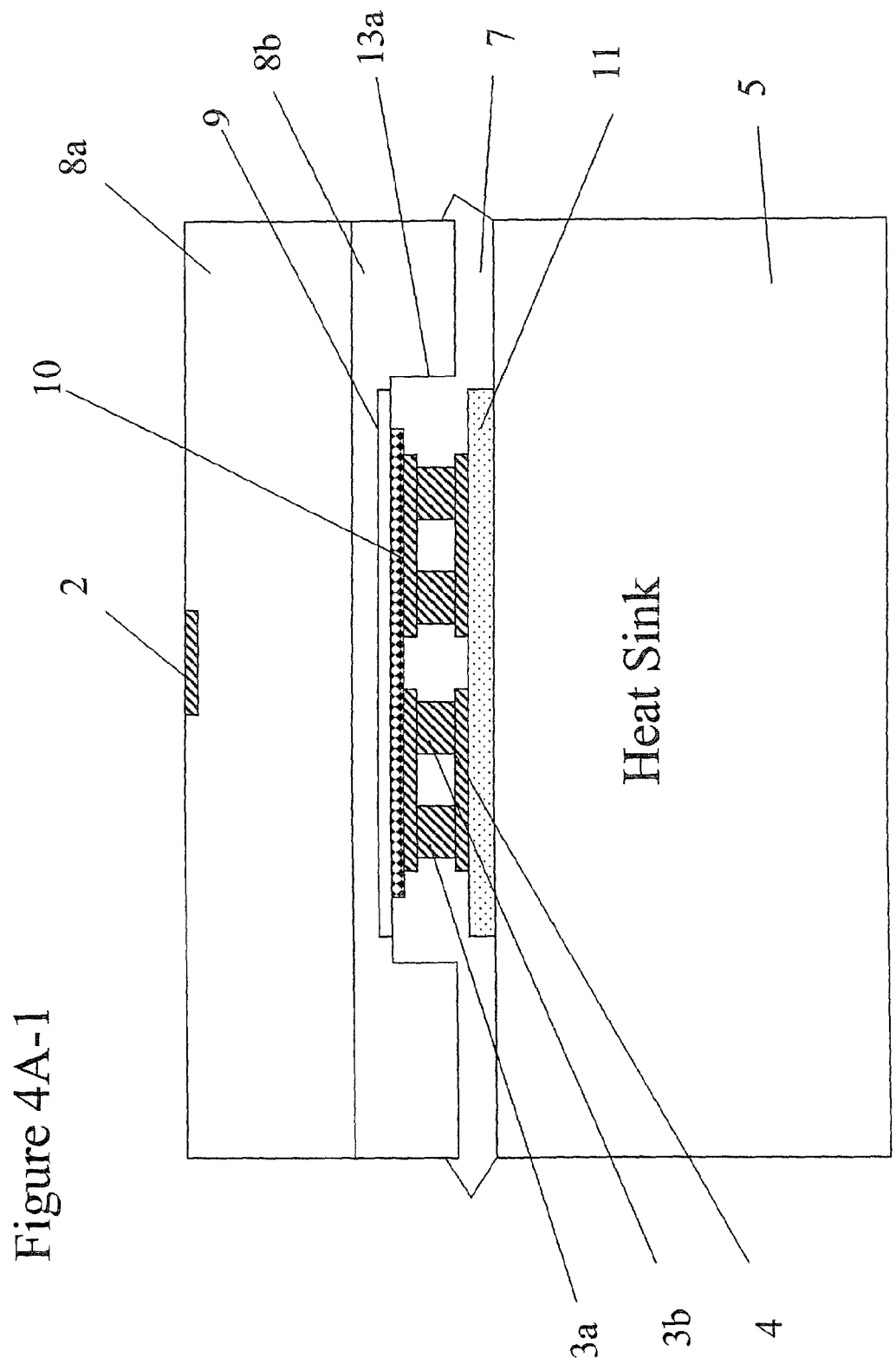
FIG. 1 is a schematic of a thermoelectric device structure according to the present invention for cooling a heat dissipating component on for example a chip die.
FIG. 4A is a schematic of a thermoelectric device structure according to the present invention in which a thermoelectric device is embedded in a recess of the semiconductor material containing the die.

Referring now to the drawings, wherein like reference numerals designate identical, or corresponding parts throughout the several views, and more particularly to FIG. 1 thereof, FIG. 1 depicts a schematic of one embodiment of a thermoelectric device structure according to the present invention. As shown in FIG. 1, a thermoelectric device structure 1 of the present invention is coupled to a heat-generating device 2a such as, for example, an integrated circuit chip contained in the medium 8. For example, integrated circuit devices requiring cooling of hot spots 2 include microprocessors, graphic processors and other heat-generating devices fabricated in mediums 8 such as for example silicon, germanium, silicon-germanium, gallium arsenide, or any such semiconductor material. The thermoelectric device structure 1 of the present invention permits the temperature of the hot spot 2 of the heat-generating device 2a to be reduced such as, for example, by 5° C. relative to a temperature that the hot spot 2 would operate at if the thermoelectric device structure 1 were not present (i.e., if the region shown in FIG. 1 where the thermoelectric device structure 1 is present were merely a thermal interface material 7 or a thermal interface compound). In some applications of the present invention, the hot spot temperature can be reduced from at least 0.5° C. to as much as 200° C., depending on the particular cooling application.

The thermoelectric device structure 1 of the present invention addresses several issues in integrating the thermoelectric device coolers to an IC chip. The thermoelectric device structure 1 of the present invention includes various heat extraction devices such as for example the thermoelectric devices 3 shown in FIG. 1, each having lower side headers 4 that dissipate heat from the thermoelectric device 3 into a heat sink 5. Other heat extraction devices suitable for the present invention include thermionic devices and a thermo-tunneling device known in the art, as described by U.S. Pat. Nos. 6,323,414 and 6,417,060, the entire contents of which are incorporated herein by reference.

The thermoelectric device 3 includes pairs of n-type and p-type thermoelements 3a and 3b. In this embodiment of the present invention, heat from the hot spot 2, and the immediately adjacent portion of the heat-generating device 2a, is thermoelectrically pumped from the semiconductor material 8 which is coupled to upper side header 6, through the n-type and p-type thermoelements 3a and 3b and dissipated to the lower side header 4. Heat from the lower side header 4, to which heat sink 5 is coupled, is then dissipated through heat sink 5 into the surrounding environment. Without precautions, the output heat from the thermoelectric device 3 at the lower side header 4 can return to the medium 8 by passage through the thermal interface material (TIM) 7 and into the peripheral portions of the semiconductor material 8 surrounding the thermoelectric device 3, thereby increasing the temperature of the heat-generating device over the case where the back flow of heat is not permitted.

Thus, according to the present invention, there is a thermal conductance (K1') between the boundary of the semiconductor material 8 and the thermal interface material 7 and the hot spot 2 of the integrated circuit 2a, a thermal conductance (K1') between the hot-side of the thermoelectric device 3 (i.e., from the lower side header 4) and the boundary between the semiconductor material 8 and the thermal interface material 7, a thermal conductance (K2) between hot-side of the thermoelectric device 3 (i.e., the lower side header 4) and the heat sink 5, and a thermal conductance (K3) between the backside of the integrated circuit 2a and the heat sink 5. K1" is the thermal conductance of the material adjacent to the thermoelectric device, that is in a region between 0.01 and 1.0 times the width of the thermoelectric device and preferably in region between 0.01 and 0.5 times the width of the thermoelectric device. K3 is the thermal conductance of the material beyond the material associated with K1". A higher K3 will enable better dissipation of heat from the backside of the integrated circuit 2a through the heat sink to the environment. A higher thermal conductance K2 will allow better dissipation of heat from the lower side header 4 through the heat sink to the environment. It is preferred that K2 be as large as possible such that the majority of the heat being thermoelectrically pumped away from the hot spot 2, by thermoelectric device 3 to lower side header 4, will be dissipated through the heat sink 5 rather than being allowed to return to the hot spot 2 (i.e., through the TIM 7 and the semiconductor material 8), which would reduce the benefit of thermoelectric device 3. According to the present invention, the typical the ratio of K1"/K2 ranges from 0.001 to 0.5.

In order that these thermal conductances and ratios be maintained as prescribed, control of the thermal conduction properties of a thermal interface material (TIM) 7 plays a significant role in achieving the targeted reduction in the temperature of the heat-dissipating device 2 (referred to herein as the hot-spot temperature). Thermal conductances K1" and K3 are both largely dependent on the respective thermal conductances of the TIM 7, the semiconductor material 8 and the junction between those materials. A TIM 7 with a high thermal conductance promotes a higher thermal conductance K3 and is therefore beneficial to the cooling of the backside of the integrated circuit 2a. However, a thermal interface material (TIM 7) with high thermal conductance can promote a higher thermal conductance K1" and thereby reduces the benefit of the thermoelectric device 3 and is potentially detrimental to the cooling of the hot spot 2 if K2 is not sufficiently large. Thus, the present invention counter intuitively reduces the vertical thermal conductance K1" very near the thermoelectric device to be less than K2 (as described by the above-noted ratio ranges) to restrict inadvertent heat flow from the hot side of the thermoelectric device 3 to the hot spot 2.

Besides having thermal conduction properties, the TIM 7 has to be compliant to reduce stress between the thermoelectric device 3 and the heat-dissipating device 2 and to reduce the stress between these two elements and external heatsinks. Accordingly, in one embodiment of the present invention, a traditional, non-electrically-conducting, TIM material (thermal conductivity in the range of 0.1 to 10 W/mK) is utilized in a thinner format (i.e., 5 microns to less than 150 microns) than traditionally needed (i.e., 150 microns or more) to preserve electrical isolation between the TE and the power device circuit. Conventional TIM materials include thermal greases, conductive compounds, conductive elastomers, and conductive adhesive tapes. Thermal greases and compounds provide the lowest interface resistance, but greases and compounds are pastes and require care in handling. Elastomers eliminate handling problems but they sometimes require high compressive loads even with well prepared surfaces. Thermal tapes offer great convenience but their gap filling properties are limited.

Utilization of thinner TIM materials in the present invention is accomplished by preferably inserting an electrical isolation film 9 on one side or another of the TIM 7. The TIM 7 materials have a low coefficient of thermal expansion (CTE) or a CTE matched to that of the silicon chip as an example. Plasma deposited or evaporated films of silicon nitride or silicon dioxide or multilayers of these layers are suitable for the present invention. Further, these oxides and oxides such as $Ta_2O_5$ in thickness range of 100 to 5000 Angstroms are suitable. In one embodiment of the present invention, a highly thermally-conducting TIM material (such as for example materials with thermal conductivities in the range of 1 to 20 W/mK) can be utilized for thermal conduction while a thin (e.g., 10 nm) oxide coating provides electrical isolation.

Further, the headers (i.e., the upper side and lower side headers 4 and 6) of the present invention can be made from silicon having for example a thermal conductivity of 1.2 to 1.6 W/cm-K having a thin (i.e. ~10 nm to 1000 nm) $SiO_2$ or $Si_xN_y$ layer of a thermal conductivity of ~0.015 W/cm-K deposited thereon. Additionally, the headers of the present invention can also be made from a Cu substrate of a thermal conductivity of ~4 W/cm-K having a thin (i.e. ~100 to 1000 nm) $SiO_2$ or $Si_xN_y$ layer of a thermal conductivity of ~0.015 W/cm-K deposited thereon.

Moreover, a combination of high thermal conductive materials like highly oriented pyrolytic graphite, carbon foams, graphite foams can be used to enhance the rejection of heat from the hot side of the thermoelectric device. These materials can be used as a part or for the entirety of the heat spreader plate. Thermal conductivity of these materials can be five times that of the thermal conductivity of copper along the desired direction of heat-flow, even if these materials have lower thermal conductivities in other directions. These materials would be extremely efficient in dissipating heat from the heat sink of the thermoelectric devices.

Figure 2:
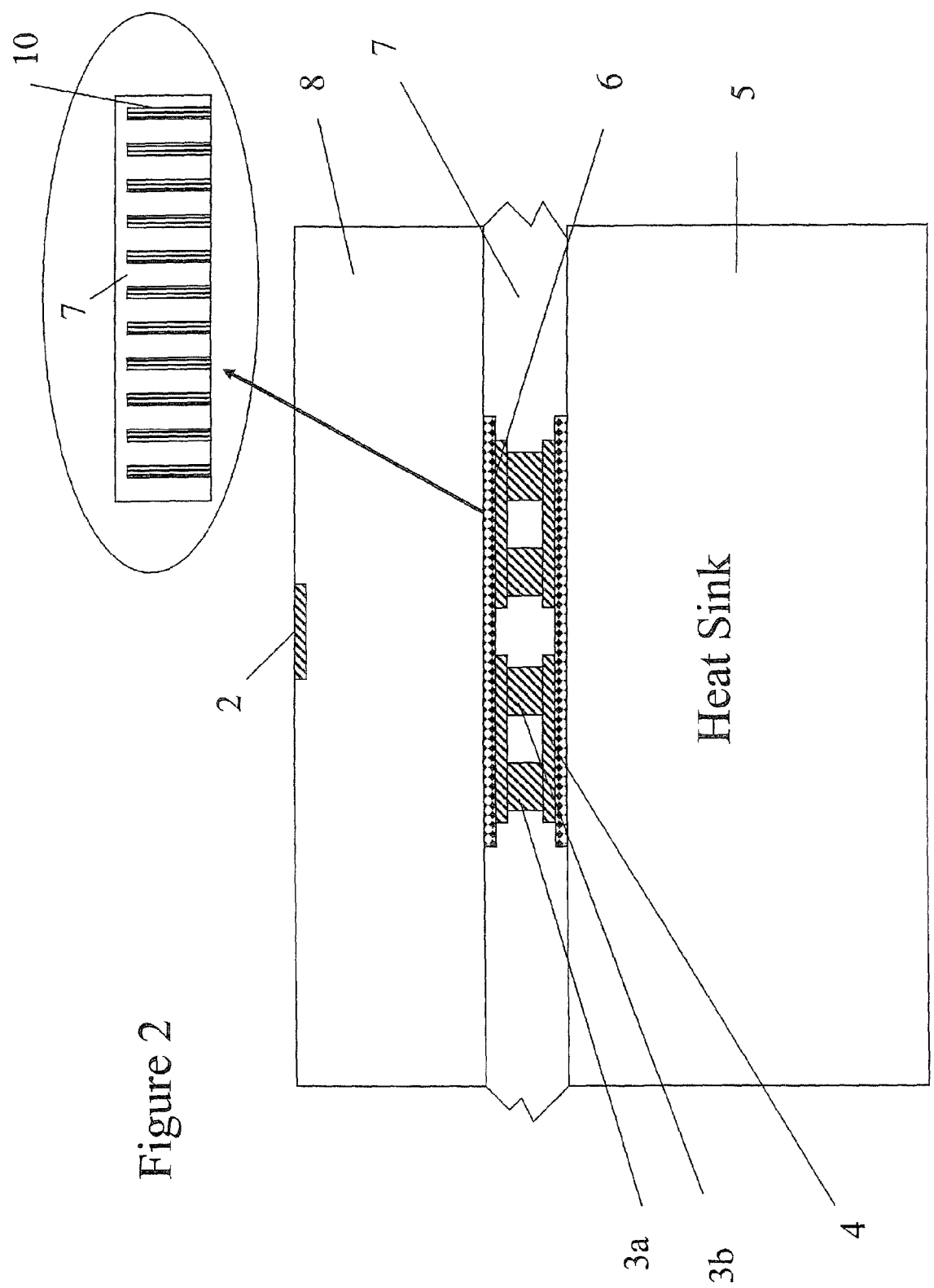
FIG. 2 is a schematic of a thermoelectric device structure according to the present invention including metallic conducting structures incorporated in a thermal interface material between the thermoelectric cooler and the die.

As illustrated in FIG. 2 for another embodiment of the present invention, inside the traditional TIM materials, metallic conducting structures 10 such as for example metallic fins are disposed therein to increase the thermal coupling for example between the lower side header 4 and the heat sink 5 or for example between the upper side header 6 and the heat-dissipating device 2. Increases in thermal conduction across these interfaces will not have to be offset by a higher heat pumping of the thermoelectric device 3 to increase the temperature differential driving heat flux across this interface. Accordingly, without suitable thermal conductances of the TIM 7, in order to transport the requisite heat flux from the heat dissipating device 2, the higher heat pumping will increase the backside temperature of the thermoelectric device 3 at the lower side header 4, leading to the above-noted heat shunting through the semiconductor material 8 back to the heat dissipating device 2.

Figure 2A:
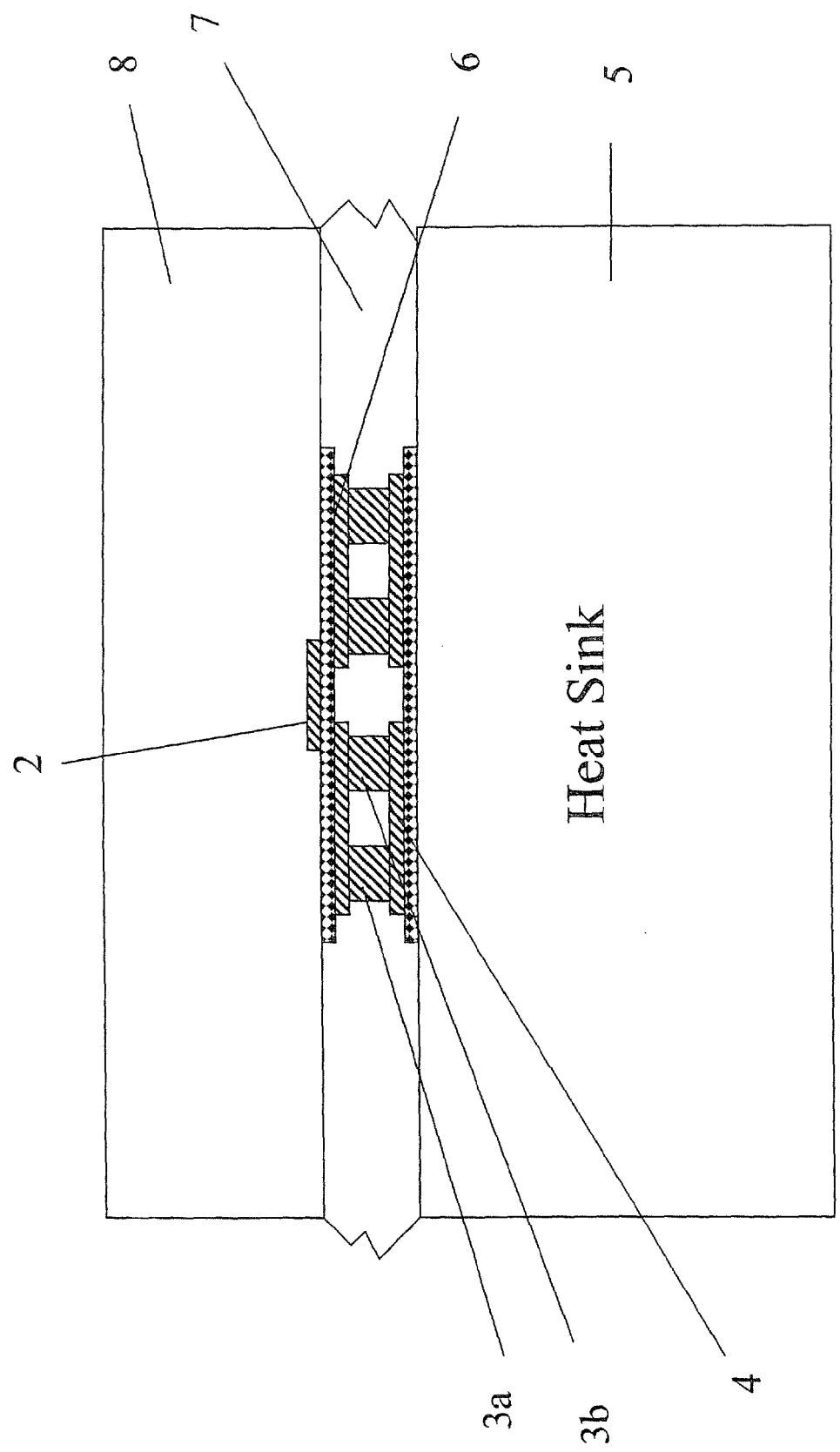
FIG. 2A is a schematic of a thermoelectric device structure according to the present invention depicting the attachment of the thermoelectric cooler to the front side of a die.

FIG. 2A is a schematic of a thermoelectric device structure according to the present invention depicting the attachment of the thermoelectric cooler to the front side of a die. In this approach, the TIM 7 between the die and the upper side header 6 would be compliant to avoid interference with the insulating or wiring components on the die front-side surface. Such materials as the above-noted conventional TIM materials could be used. Alternatively, in many electronic circuits, available space from the heat generating devices could be utilized for thermal coupling of heat from the die front side to the thermoelectric device 3.

Figure 2B:
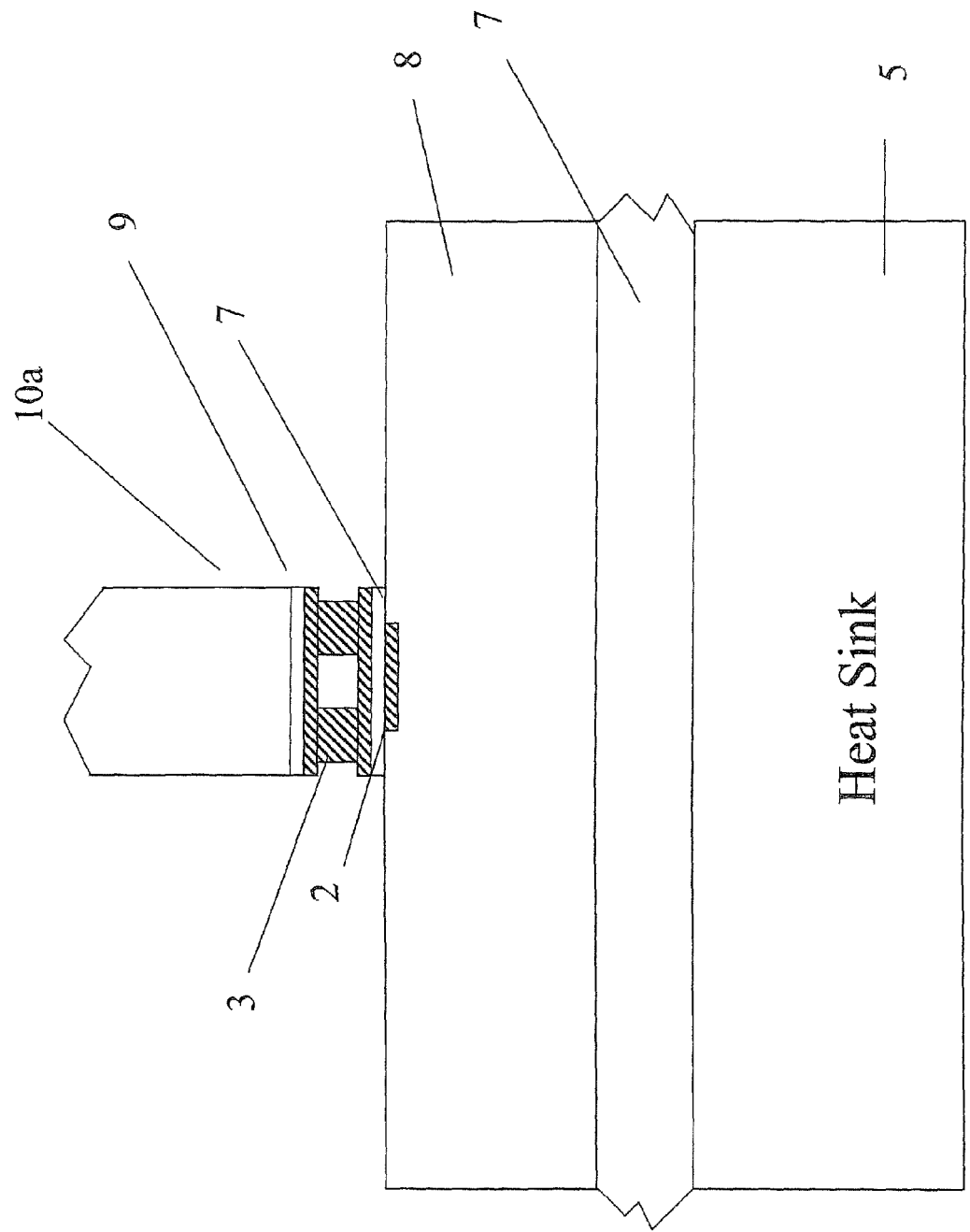
FIG. 2B is a schematic of a thermoelectric device structure according to the present invention depicting a top-mounted attachment of the thermoelectric cooler to the front side of a die.

Illustrated in FIG. 2B is another embodiment of the present invention in which the thermoelectric device 3 is attached on the same side of the semiconductor material 8 as the heat-dissipating device 2 with high conductivity thermoelectric interface material 7. In this embodiment, the area of thermoelectric device is commensurate with that of the heat-dissipating device, and as result the thermoelectric device will primarily pump the heat directly generated by the heat-dissipating device, and will not pump a significant amount of heat from the surrounding areas. Heat pumped by the thermoelectric device is rejected into a long, narrow heat conducting device 10a, which could consist of a copper rod or a heat pipe, for example. The length of the heat conducting device 10a is designed to conduct heat from the surface of the heat generating device 2 to a region removed from the thermoelectric device where the dissipated heat will not return to the heat generating device. Such a device could couple the heat into the primary heat sink 5. By using this arrangement, the thermoelectric device can have reduced heat pumping capacity and size compared to a similar device mounted on the opposite side of the semiconductor material. The small size of the thermoelectric device, in combination with the narrow heat rejection device, allows minimal disruption of the electrical contacts to the active side of the semiconductor material. The configuration shown in FIG. 2B, in one embodiment, can supplement back side cooling as illustrated in FIGS. 1 and 2. Alternatively, due to the relatively small scale (e.g., 100 μm×100 μm to 2 mm×2 mm) for the thermoelectric devices 3 of the present invention, the thermoelectric devices 3 shown in FIG. 2B can be used independent of active thermoelectric backside cooling.

Figure 3:
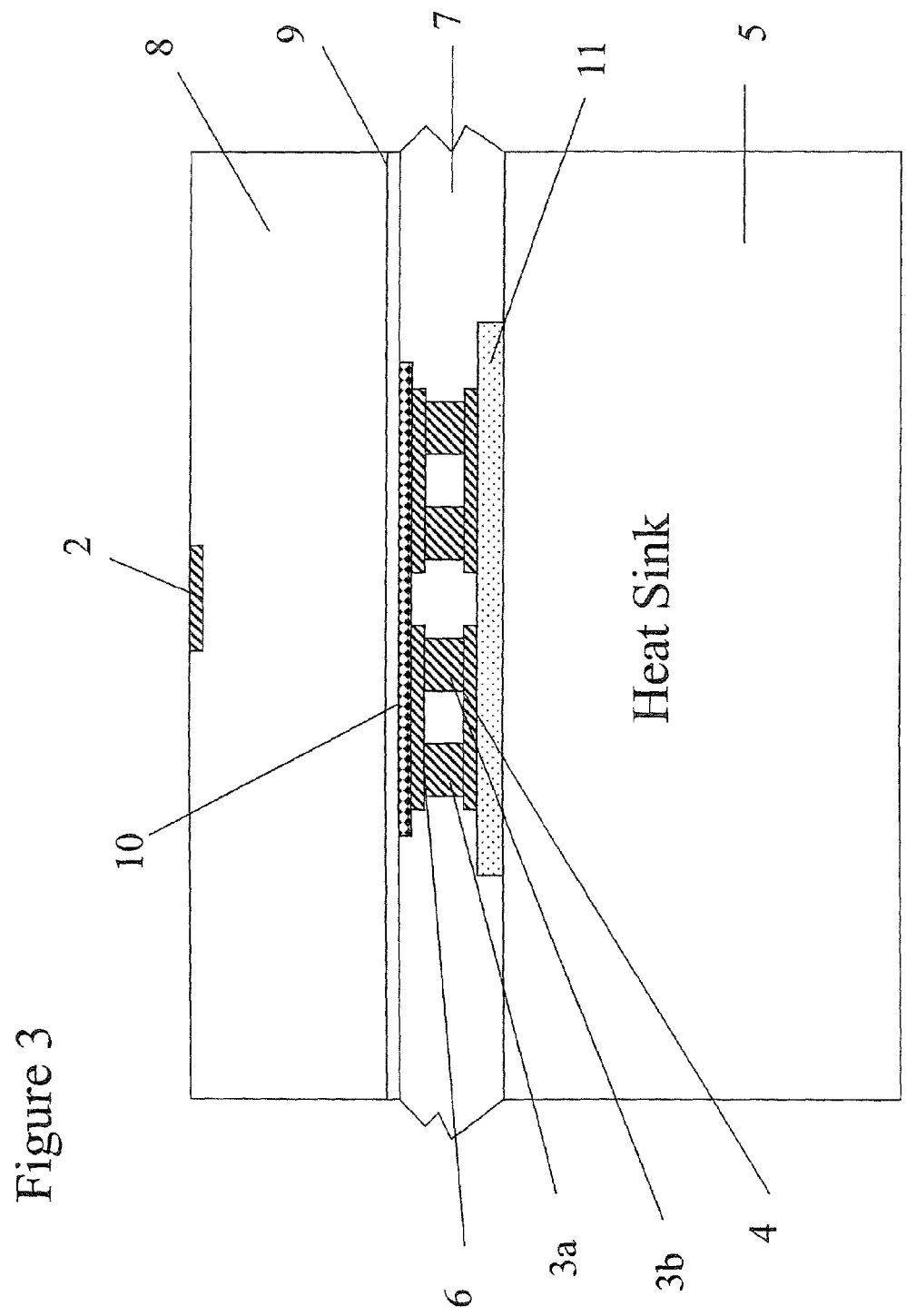
FIG. 3 is a schematic of a thermoelectric device structure according to the present invention including an intermediate heat sink that disperses the concentration of the heat into the ultimate heat sink coupling heat to the outside environment.

In another approach of the present invention, the heat exiting the lower side header 4 is dispersed (i.e. decreasing heat flux) before being coupled to the heat sink 6. By introducing heat from the thermoelectric device 3 into the heat sink 6 at the same rate as would have occurred had no thermoelectric device 3 been inserted in the path from the heat dissipating device 2 to the heat sink 6, there is no inadvertent shunting of heat back to the heat dissipating device 2. Structures, as illustrated in FIG. 3, include for example an intermediate heat sink 11 that disperses the concentration of the heat flux such that the heat flux into the heat sink 5 in the vicinity of the thermoelectric device 3 is not substantially different than the heat flux in an adjacent area whose heat flux is determined based on thermal conduction through the semiconductor material 8 and the TIM interface 7. The thermal conductivity of the intermediate heat sink 11 is preferably greater than 1 W/cm-K, and preferably greater than 2 W/cm-K.

In yet another embodiment of the present invention, as illustrated in FIG. 4A, the thermoelectric device 3 is embedded in a recess 13a of the semiconductor material 8. The aspect ratio is defined as L/A where L=depth of recess and A is area. L can vary from 25 to 200 μm. The area A can vary from 0.01 to 1 square centimeters. Accordingly, the aspect ratio of the recess 13a in the semiconductor material 8 reduces the heat flux through the surrounding material of the integrated heat sink and therefore ameliorates the above-noted inadvertent heat shunting. Such aspect ratios can range, in one embodiment of the present invention, from 0.0025 to 2 cm$^{-1}$. The depth of the recess 13a can be sufficient to accommodate the thermoelectric device 3 within the recess. The geometry in FIG. 4A results in the above-noted thermal conductance K1" being lower than the conductance K3 removed from the thermoelectric device 3.

Figure 4B:
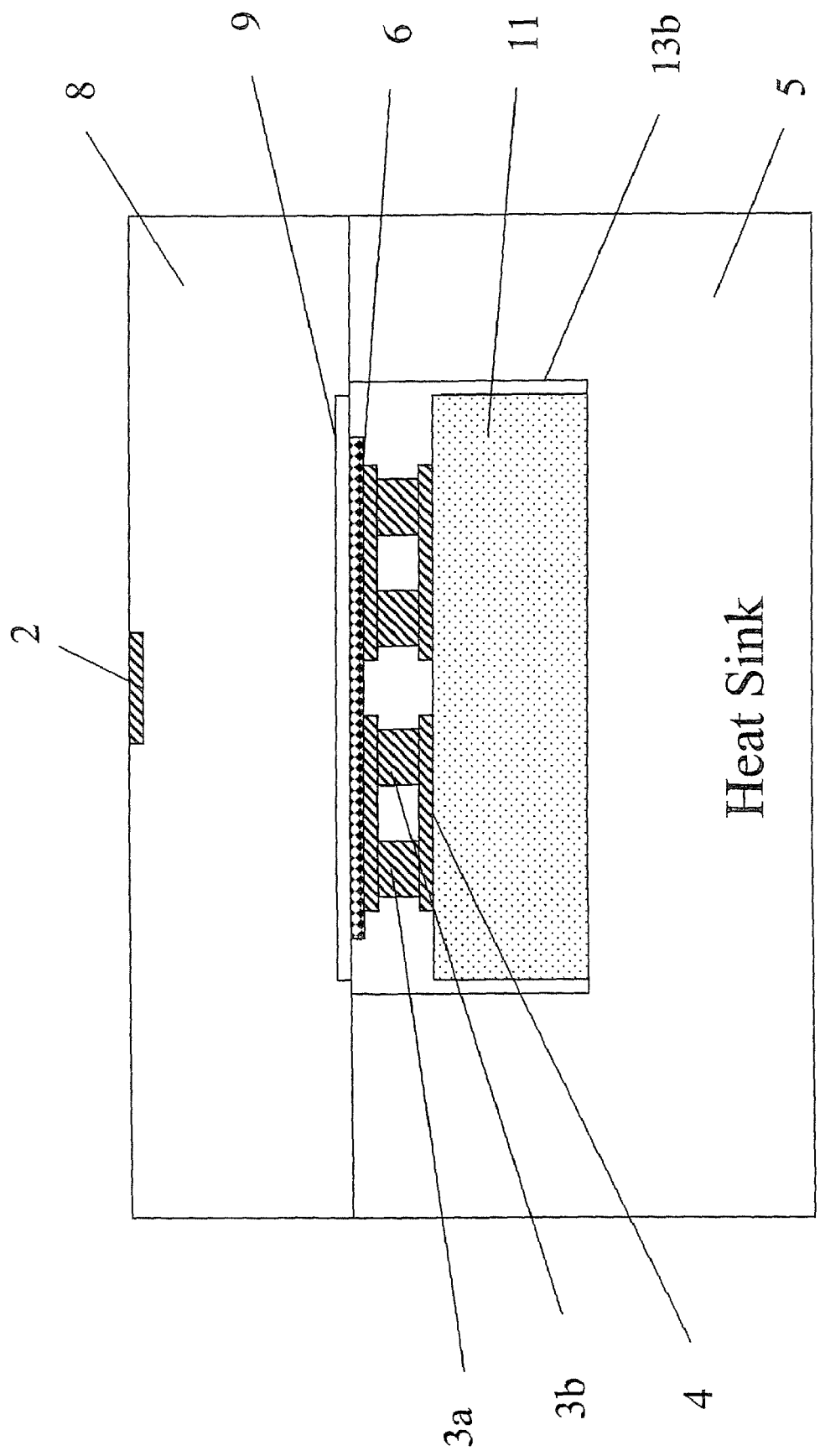
FIG. 4B is a schematic of a thermoelectric device structure according to the present invention in which a thermoelectric device is embedded in a recess of an integrated heat sink coupled to the heat dissipating component.

Further, the semiconductor material 8 shown in FIG. 4A as being one body can be composed as shown in FIG. 4A-1 of a layered structure in which the semiconductor material 8a constitutes the upper half and an insulating material 8b constitutes the lower half, as for example in a silicon on sapphire chip. The recess 13a can extend partially through, but preferably entirely through, the insulating material 8b In still another embodiment of the present invention, as illustrated in FIG. 4B, the thermoelectric device 3 is embedded in a recess 13b of the heat sink 5. The aspect ratio of the recess 13b in the heat sink 5 reduces the heat flux traveling back toward the semiconductor material 8 and the TIM interface 7. In this embodiment as above, the aspect ratio of the recess of the integrated heat sink decreases the above noted hot spot temperature reducing the active heat pumping requirements demanded of the thermoelectric device 3. Such aspect ratios can range, in one embodiment of the present invention, from 0.0025 to 2 cm$^{-1}$. The geometry in FIG. 4B results in the above-noted thermal conductance K1" being lower than the conductance K3 removed from the thermoelectric device 3.

Figure 5A:
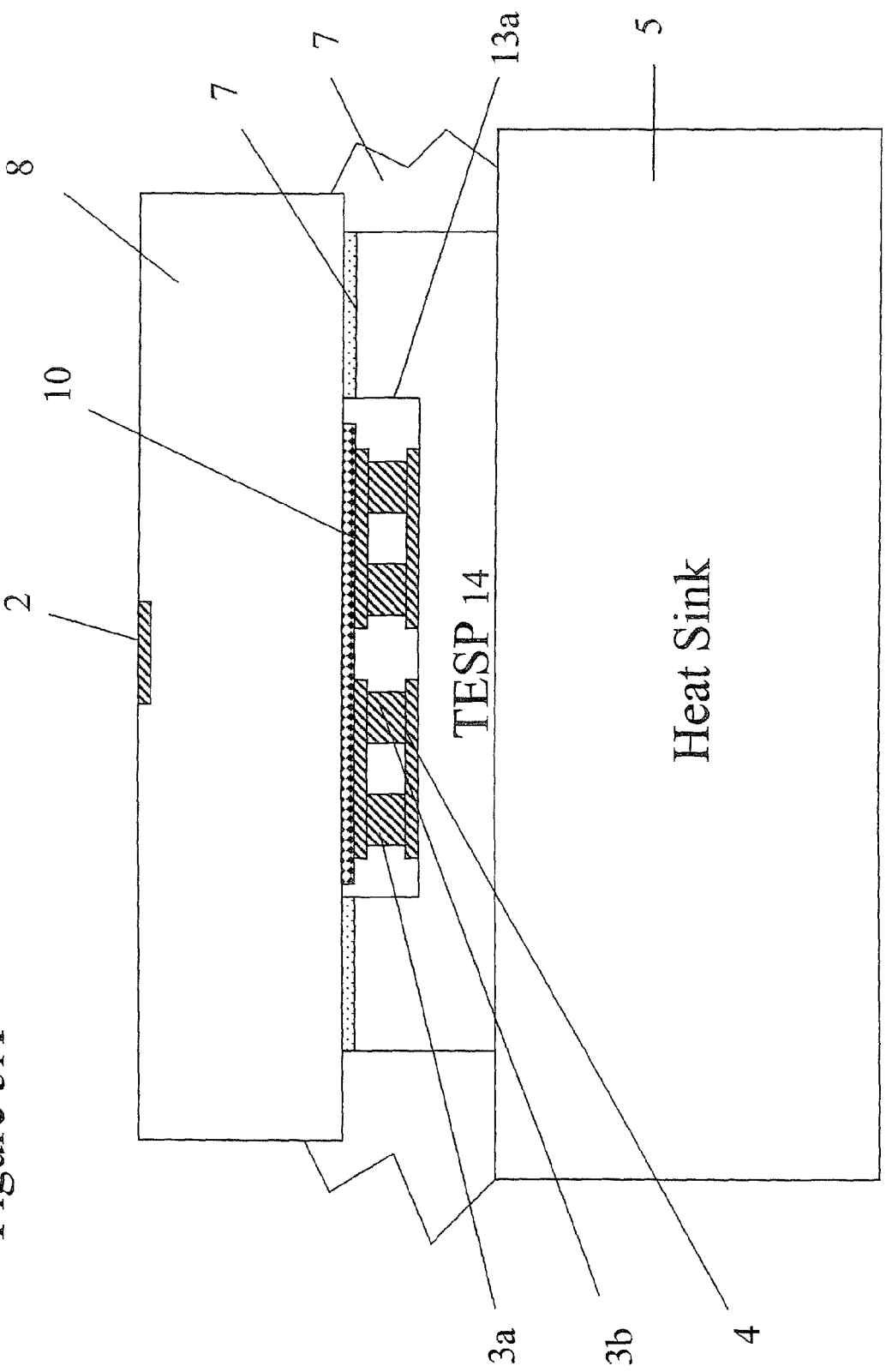
FIG. 5A is a schematic of a thermoelectric device structure according to the present invention including a thermoelectric device incorporated on a thermoelectric support plate of the present invention.

In still another approach of the present invention, heat dissipating devices 2 for example contained on chip die are coupled to a thermoelectric device 3 incorporated in a high thermal conductivity thermoelectric support plate (TESP) 14, as illustrated in FIG. 5A. The TESP 14 preferably is an anisotropic thermal conductor having a higher thermal conductance along a path to the heat sink 5 than along a lateral path to the semiconductor material 8. In one embodiment implementing this approach, the TIM 7 between the TESP 14 and semiconductor material 8 is designed to have a lower thermal conductance than the boundary TIM 7 surrounding the TESP 14.

Further, the side walls 14a of the TESP 14, while shown as vertical in FIG. 5A, can be tapered as shown in FIG. 5A-1. A tapering of the sidewall 14a increases the thermal resistance from the TESP 14 back to the semiconductor material 8, thus minimizing inadvertent heat flux back towards the heat dissipating device 2. One example of a suitable taper, according to the present invention, would be for the sidewall 14a of the TESP 14 to be tapered at an angle of 59.7°, as is possible by anisotropic etching of a silicon wafer. Other taper angles are suitable in the present invention to reduce inadvertent heat flow conduction back to the semiconductor medium 8. The geometry in FIGS. 5A and 5A-1 results in the above-noted thermal conductance K1" being lower than the conductance K3 removed from the thermoelectric device 3.

In still another embodiment of the present invention, a thickness of the thermoelectric device structure 1 is reduced so that the entirety of surface outside the thermoelectric device 3 can be filled (i.e. planarized) with a TIM material having a thermal conductivity of 10 W/m-K or higher.

Figure 5B:
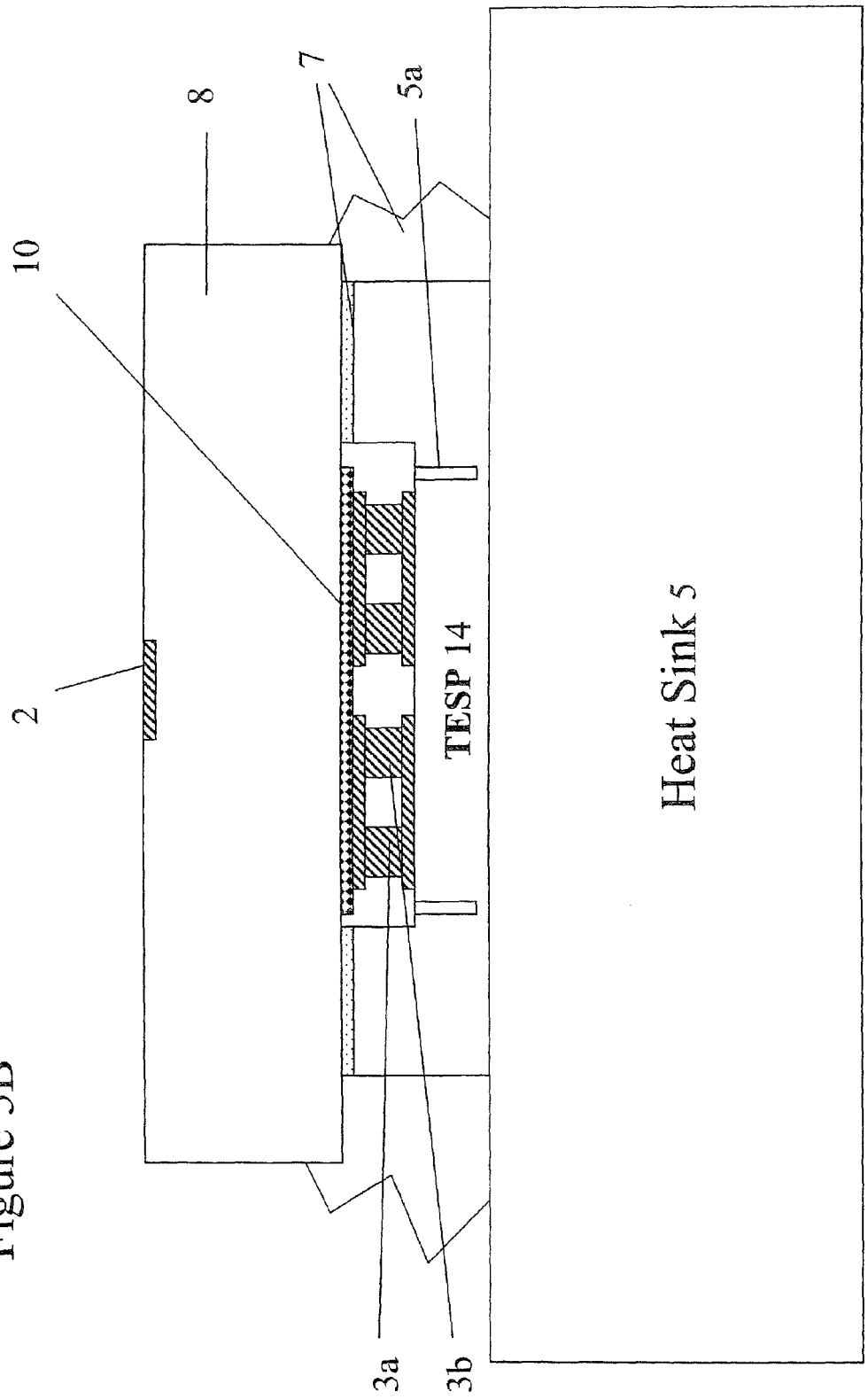
FIG. 5B is a schematic of a thermoelectric device structure according to the present invention including a thermoelectric device incorporated on a slotted thermoelectric support plate of the present invention.

In yet another embodiment of the present invention, as shown in FIG. 5B, the TESP 14 constitutes a split header having slits 5a. It should be noted that, in this embodiment, there are slits such as 5a on all four sides of the TE element. The slit depth can vary from, for example, as much as an amount equal to the depth of the main cavity containing the TE element to as little as one half of such depth. (e.g., 25-100 μm). The slit width can vary from 2 to 25 μm. The split header, while providing some degree of compliance to accommodate thermal stress, is configured with slits positioned such that heat entering the TESP 14 from the thermoelectric device 3 is more likely to be dissipated into the heat sink 5 than to be conducted back into the semiconductor material 8.

Figure 6A:
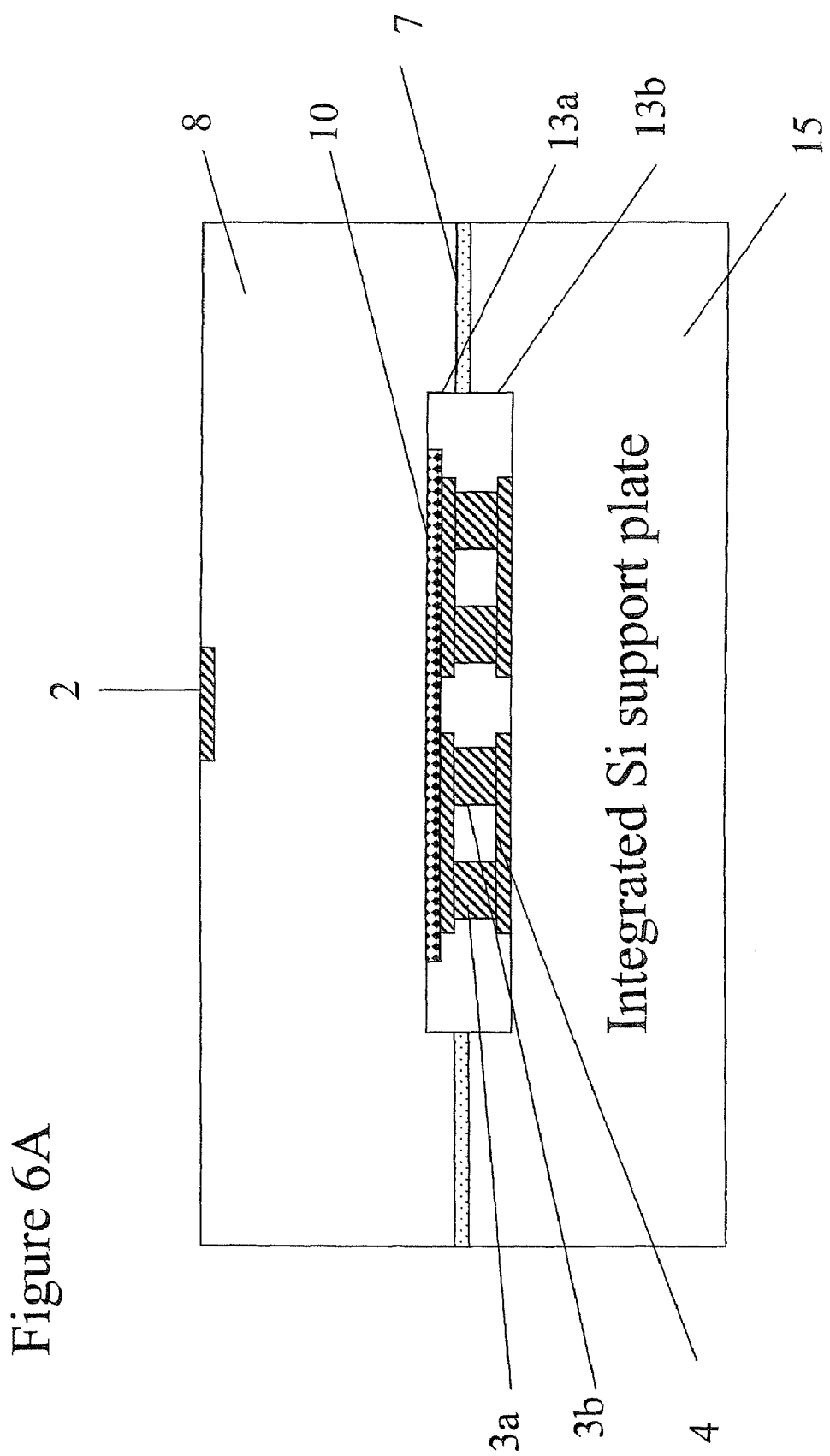
FIG. 6A is a schematic of a thermoelectric device structure according to the present invention including an integrated silicon thermoelectric support plate of the present invention.

FIG. 6A is a schematic of a thermoelectric device structure according to one embodiment of the present invention including an integrated silicon thermoelectric support plate 15 of the present invention. As shown in FIG. 6A, an integrated Si support plate 15 constitutes a heat sink/spreader. By incorporating the thermoelectric device 3 in a structure having silicon material on both sides of the thermoelectric device 3, thermal stresses on the thermoelectric device 3 are minimized. Such incorporation allows integration of cooling devices made on a wafer scale, on one silicon wafer, to be mated with microprocessor chips or other devices made on another silicon wafer, thereby matching the foot-prints of cooling devices on one Si wafer to heat loads of chips on another wafer. The two Si wafers can be bonded with appropriate bonding methods. The Si support plate containing the cooling devices can be made with conventional microelectronic techniques. Further, two Si wafers, after bonding and mating of the TE devices to their hot-spot cooling areas, can be diced as a composite for further wire bonding and pins etc. The recesses 13a and 13b are similar to the recesses described previously and can, in one embodiment of the present invention, have an aspect ratio varying from 0.0025 to 2 cm$^{-1}$.

Figure 6B:
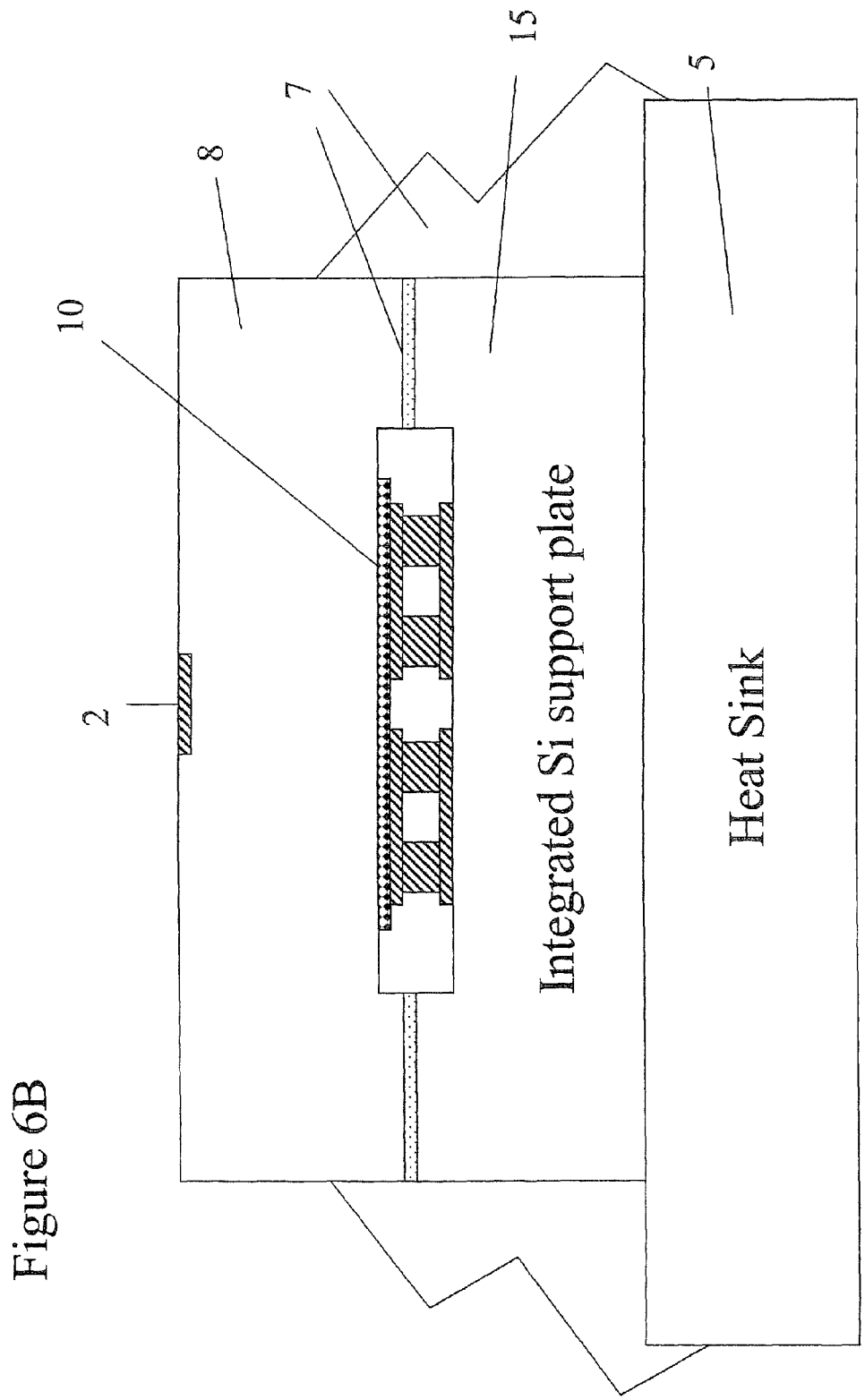
FIG. 6B is a schematic of a thermoelectric device structure according to the present invention including the integrated silicon thermoelectric support plate coupled to the ultimate heat sink.

FIG. 6B depicts another embodiment of the present invention in which an integrated silicon thermoelectric support plate 15 is coupled to the ultimate heat sink 5. As also illustrated in FIG. 6B, the TIM material 7 can fill regions outside the thermoelectric support plate 15 and thereby further conduct heat to the heat sink 5.

The thermoelectric device 3 of the present invention preferably operates with a high active flux through each of the thermoelements 3a and 3b while having a low input/output flux across the entirety of the thermoelectric device. As described herein, this aspect of the present invention is referred as High Active Flux-Low Input-Output Flux (HAF-LIOF). In this aspect, the heat flux through the heat gatherer (e.g. an upper side header 6) and the heat spreader (e.g. a lower side header 4) is smaller than the heat flux through the n and p-type thermoelements 3a and 3b due to the reduced packing fraction of the thermoelements. A packing fraction of the thermoelements relative to the area of the headers 4 and 6 permits the utilization of thinner thermoelements, thereby reducing the fabrication costs that would be involved should for example thicker sections of high ZT materials be required to maintain the requisite ΔT across the thermoelectric device.

The packing fraction of thermoelements (i.e., the fraction of area occupied by the pair of n and p-type thermoelements 3a and 3b relative to a unit area of for example the upper-side header 6) in one embodiment of the present invention is less than 50%, preferably less than 20%, and can be significantly lower, such as for example 0.5-1%. A unit area for the heat spreader is defined as that fraction of the total area of the heat spreader which principally conducts heat into one of the associated pairs of n and p-type thermoelements attached to the heat spreader. For a single pair of n and p-type thermoelements, the unit area would be one half area of the upper side header 6 shown in FIG. 1. For instance, while the total heat flux into upper-side header 6 and out the lower-side header 4 can be on the order of 10-30 W/cm$^2$, the heat flux through each thermoelectric pair 3a and 3b can be as much as a factor of 100 times higher. As such, a high internal heat-flux exists within the individual thermoelectric elements (e.g., ~900 W/cm$^2$ for a ΔT across each stage of 40 K). Meanwhile, a low external heat-flux exists across the entirety of the thermoelectric device (e.g., a range from 5 to 15 W/cm$^2$). Details of the packing fraction selection and determination are described in U.S. Provisional Application No. 60/528,479.

The concepts of the present invention are not restricted to any particular family of thermoelectric materials. The use of superlattice material or other high ZT material improves thermoelectric device efficiency of the HAF-LIOF thermoelectric device of the present invention. Selection of appropriate materials for the thermoelements are likewise described in detail in U.S. Provisional Application No. 60/528,479. As described therein, high ZT thin films in the PbTe/PbSe and in the SiGe material system can be used in superlattice configurations or other quantum-confined structures such as for example, PbTe-based quantum-dot superlattices (QDSL). Additionally, $Bi_2Te_3$-superlattice/PbTe/SiGe material combinations and superlattices of Si/Ge, PbTe/PbSe, ZnSb/CdSb, InAs/InSb, CdTe/HgCdTe, $Ga_xIn_{1-x}As/GayIn_{1-y}As$ can be used. As further described in U.S. Provisional Application No. 60/528,479, p and n-type $Bi_2Te_3$-based superlattice elements having ZT~3.5 in p-type superlattices and ~2.0 in n-type can be utilized. Utilization of high ZT materials improves power conversion efficiencies and cooling efficiencies for the thermoelectric devices of the present invention.

In the present invention, the advances in ZT for the p and n-type superlattice materials have been incorporated into fabricated p-n thermoelement couples. By flipping the fabricated p-n couples onto a split semi-infinite Cu-plate as opposed to flipping the fabricated p-n couples onto a header with a limited-thickness metallization, a more accurate measure of the thermoelectric properties of the fabricated p-n thermoelement couples is possible. For instance, each one of the p-n thermoelement couples potentially carries a high-current (i.e., several Amps of current) and is a low-voltage thermoelectric device. Parasitic lead resistances can therefore affect the measured device efficiencies. Properties of the p-n thermoelement couples have been developed by fabrication and analysis of the p-n thermoelement couples on a split semi-infinite Cu-plate. In the fabricated thermoelectric devices, electrical contact resistances in the thermoelectric devices are minimized between the metallizations and the p-n thermoelement couples, thereby providing adequate electrical interfacing.

The contacts of the present invention can include multi-layer metallizations of Cr/Au/Ni/Au and Ni/Au. Examples of other conductive metal layers suitable for use in the present invention include Au, Cu, Ni, Ag, Pd, Pt, Al, Ga, In, and alloys containing these metals. The use of Cr is desired for improving or obtaining better adhesion of the metal layer to the superlattice surface. Examples of other adhesion promoters suitable for use in the present invention besides Cr are NiCr, Ti, Mo, W, and alloys containing these metals. Ni is included to provide a diffusion barrier to bonding materials such as Pb—Sn, which are needed in bonding the thermoelectric devices to a heat-source or heat-sink header from diffusing into the superlattice. Examples of other diffusion barriers suitable for use in the present invention besides Ni include Cr, Pd, Fe, and other metals, thickness of a few thousand Angstroms to several microns, with a lattice structure different from the superlattice materials.

The thickness of various ohmic metallizations of the present invention can be Cr/Au/Ni/Au of 300 Å/3000 Å/300 Å/3000 Å and Ni/Au of 300 Å/3000 Å, upon which additional metals such as thick Au or Pb—Sn can be used to reduce spreading resistances.

For the 10 Å/50 Å $Bi_2Te_3/Sb_2Te_3$ superlattice shown in FIG. 3b, the measured cross-plane electrical resistivity ($\rho\perp$) is 8.47E-4 Ohm-cm. With an in-plane electrical resistivity ($\rho_{in-plane}$) of 9.48E-4 Ohm-cm, $\rho\perp/\rho_{in-plane}$ or $\mu\perp/\mu_{in-plane}$ is ~1.12. For the sample in FIG. 3c, $\rho\perp$ is 5.26e-4 Ohm-cm and the $\rho_{in-plane}$ is 5.5E-4 Ohm-cm, and the anisotropy is ~1.05.

In addition to managing electrical contact resistances, thermal interface resistances are reduced in the metal-to-dielectric interfaces of the present invention by deep-annealing of a metal into the dielectric bulk or by utilizing an AlN-diffused Al—Cu interface or AlN fused onto Cu. The AlN can be ionic fused onto copper directly or Al on Copper can be preferentially oxidized or nitrided or AlN plates can be soldered onto copper plates. The use of ionic fused materials are discussed separately elsewhere. Regardless of technique employed, the thermal interface should have a thermal conductivity of 0.1 W/cm$^2$K to 0.001 W/cm$^2$K.

Various methods are available for the manufacturing of the devices and the device components of the present invention. Such methods are described in U.S. Provisional Application No. 60/528,479 and referred to therein as inverted-couple processing. The table shown in FIGS. 7A and 7B illustrates the inverted processing approach suitable for the present invention.

In one fabrication method of the present invention, substrates including the individual n-type and p-type thermoelements are separated, for example by scribing or laser dicing, into individual segments. The individual segments are then bonded onto a header such that alternating n-type and p-type conductivity materials exist between each adjacent thermoelement. The surfaces of the header that come in contact with the n- and p-type segments are preferably metallized prior to assembly to provide low-resistance electrical connection between adjacent n- and p-type segments where necessary to electrically interconnect adjacent thermoelements. Likewise, the surfaces of the individual n-type and p-type thermoelements that come in contact with the header are preferably metallized prior to assembly to provide the necessary low-resistance electrical connection to the n-type and p-type thermoelements, else a high electrical contact resistance can limit the efficiency of the thermoelectric stage and the resultant thermoelectric device.

Following bonding of n- and p-type segments, the substrates from each of the p- and n-segments are selectively removed for example by using selective etchants. The thermoelements are then patterned using photolithographic patterning followed for example by etching, or by laser ablation, to produce the desired cross-sectional thermal conduction area for the present invention (i.e., to set the aspect ratio and ultimately determine the packing fraction). Low resistivity contact metallizations are then evaporated on an upper surface of the n- and p-type thermoelements. In this step, either the same metallization can be used for both of the n- and p-type section, or different metallizations can be used (i.e., separate evaporations), depending on the contact resistance requirements. Sheet resistances, or conductances as specified above, associated with the metallizations are designed not to restrict the performance of the thermoelectric devices.

A top, pre-patterned metallization header can, in one embodiment of the present invention, be attached to the metallized sections to function as the aforementioned heat pipe. Alternatively, the header itself prior to metallization can be patterned to provide the aforementioned heat pipe. The formed pair of thermoelements (i.e., the n thermoelement and the p-thermoelement) including the attached header can then be flipped and bonded to a second header. The second header, referred to herein as the lower side header, thermally connects the n thermoelement to the p-thermoelement, but contains patterned electrical connections such that electrically the n thermoelement 3a and the p-thermoelement 3b are individually connected, as shown in FIG. 1. The lower side header 4 thus functions as an electrical member having, as shown in FIG. 1, a split electrical contact (i.e., an electrical contact only contacting individually the n-type and p-type thermoelements 3a and 3b), while as a thermal member the bottom header functions as a continuous thermal contact.

Regardless of the formation approach (i.e. direct deposition or bonding), thick metallizations and pattering can be used, according to one embodiment of the present invention, to form the noted lower side header and to provide split electrical contact to the thermoelement pair 3a and 3b. Direct attachment by deposition or bonding permits a large number of patterned thermoelements each possessing the requisite thermal conduction area to be fabricated and electrically connected in series to provide either an output electrical contact for power conversion or for cooling. Subsequent stages of thermoelectric devices could then be added using similar procedures, or by attaching subsequent pre-fabricated stages, or by attaching selective members of subsequent stages.

One illustrative example of inverted couple processing is given below:

P-type and n-type superlattice thermoelectric films are deposited on GaAs substrates. The deposited superlattice films are patterned with Cr/Au/Ni/Au metallizations. The deposited superlattice films and/or the GaAs substrates are etched in preparation for dicing. Diced strips of the p-type and n-type superlattice films attached to the GaAs substrates are then bonded in an alternating conductivity type pattern to a header. The header includes an AlN substrate having Ti/Au metallization (annealed) and having a subsequent Cu/No/Au topmost metallization. A Sn preform bonds the diced strips to the AlN substrate (functioning as a first header). The GaAs substrate is then etch removed, and Cr/Au/Ni/Au contacts are evaporated through shadow masks or evaporated and patterned to form electrical contacts to the superlattice thin films. Thick metal pads are then formed on the evaporated contacts to define for example a heat pipe structure. Dies containing the superlattice thin films and the attached AlN header are placed and bonded to a separate split metallized header (functioning as a second header) allowing for individual electrical connection to each of the n- and p-type thin film thermoelements.

For automatic assembly of the thermoelectric device modules described above a dicer and pick-and-place tools (standard to the IC industry) can be used. A wafer dicer and robotic pick-and-place tool, provide not only cost-effective but also reliable fabrication of both mini-modules and large-scale modules. The tool is used to dice p-n couple dies from a processed wafer and to assemble these inverted couple dies into a range of devices, from mini-modules to large-array of mini-modules. The dicer and pick-and-place tools, described above can also be used according to the present invention to assemble thin-substrate (i.e. 100 µm to 250 µm thick) bulk modules as well as substrate die containing the afore-mentioned superlattice thin-film structures.

In the present invention, integration of the thermoelectric device structure of the present invention to electronic devices such as semiconductor chip packages described above can be accomplished through a number of mechanisms to be discussed in more detail below. Regardless, the thermoelectric devices of the present invention are thermally coupled to the integrated circuit devices by bonding or other thermal connection techniques.

For example, the bonding techniques described in U.S. Provisional Application No. 60/528,479 can be used join the semiconductor chip to the heat spreader. For example, a AgCuP eutectic bond or a AuIn eutectic bond or an InSn eutectic bond can be used. In one embodiment of the present invention, as described in U.S. Provisional Application No. 60/528,479, radiant thermal energy transfer can also be used to thermally connect the thermoelectric devices to the intergrated circuit devices. Radiant thermal energy transfer utilize Purcell-enhancement cavity transmitter/receiver structures such as those described in the afore-mentioned U.S. Provisional Application No. 60/253,743, the entire contents of which are incorporated herein by reference, entitled "Spontaneous emission enhanced heat transport method and structures for cooling, sensing, and power generation" for heat transfer.

Additionally, bonding in the present invention can be accomplished by the following non-limiting techniques:

1. utilization of thermal adhesives or thermally conductive epoxy,
2. soldering,
3. diffusion bonding using electroplated or evaporated metal contacts,
4. utilization of anisotropic thermal adhesives,
5. utilization of thermoplastic conductive polymers, and
6. utilization of silicon to silicon molecular bonding (in the case where the cooling header of the thermoelectric device is made from silicon).

Regardless of approach, a thermally conductive and mechanically stable connection or bond between the thermoelectric device and the integrated circuit device is preferred.

Figure 8A:
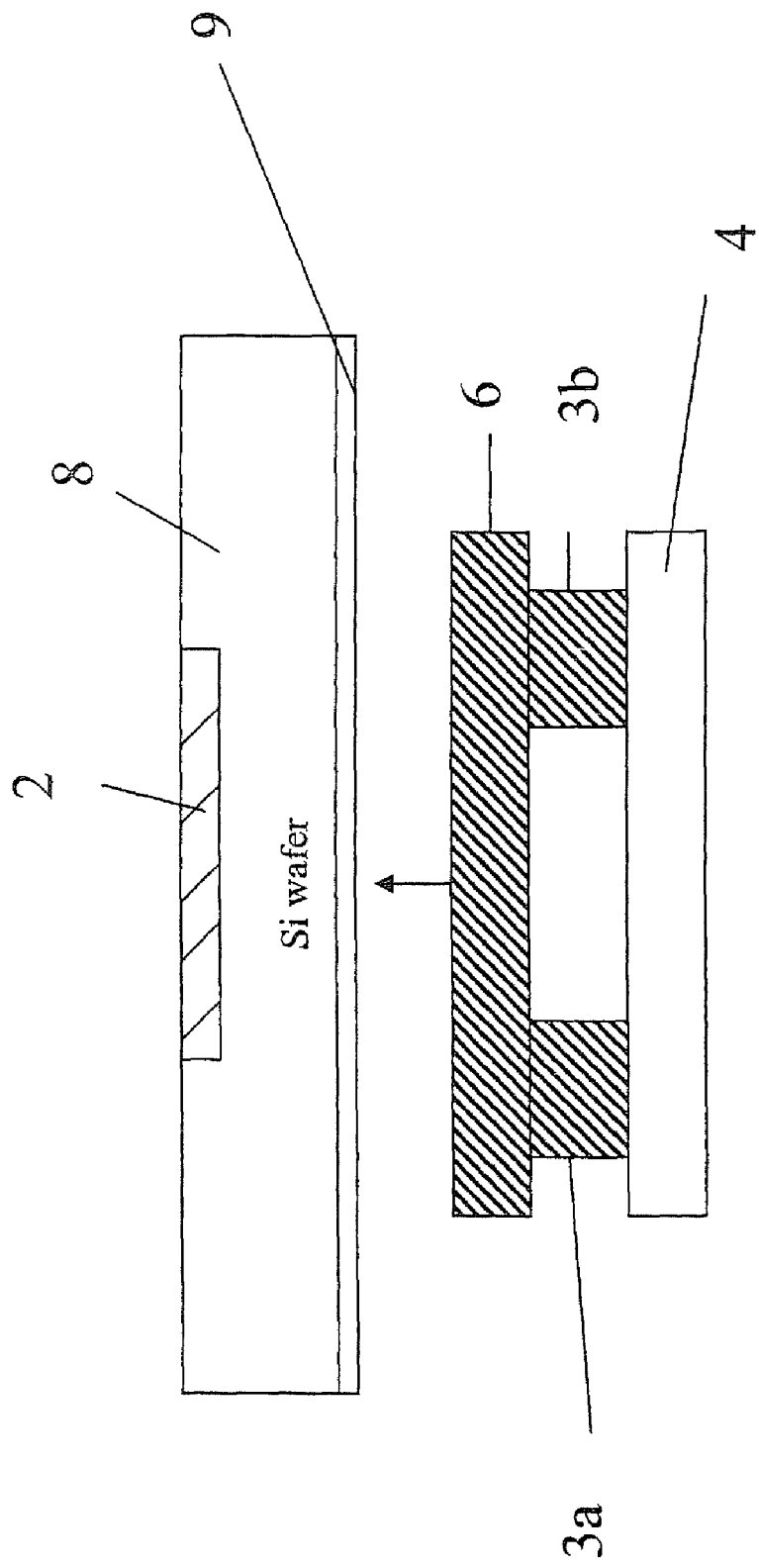

FIGS. 8A and 8B are schematics depicting the bonding of a pre-fabricated thermoelectric device to a semiconductor device chip. In this approach, bonding is used to bond the pre-fabricated thermoelectric devices to an integrated circuit die. As such, this approach separates the thermoelectric device fabrication steps from the semiconductor device chip. In this approach, a number of bonding techniques (to be discussed below) can be used to join an upper side header of the pre-fabricated thermoelectric device to the semiconductor device chip.

Accordingly, various approaches of the present invention include:

(1) attaching a pre-fabricated thermoelectric module to a device wafer,
(2) building a thermoelectric device from the backside of a device wafer, or
(3) building a part of a thermoelectric device onto the backside of a device wafer and completing fabrication by attachment of remaining pre-fabricated components.

For attachment, several attachment methods can be used including: (1) soldering, (2) brazing, (3) friction bonding, and (4) insulator-insulator bonding similar to wafer bonding. Furthermore, in a preferred embodiment, a hybrid "reactive" bonding process is utilized in which insulator surfaces, having a thin reactive metal layer, are placed opposed to one another and then contacted and heated to react the metal layer with the insulator surfaces and thereby bond the opposed components together. Such a metal include for example Ti, W, Cr, Mo, etc., or alloys thereof. These metals readily oxidize and form in a preferred embodiment silicides which melt at temperatures of 300° C. or less. The hybrid reactive bonding process of the present invention relies on the reactivity of the thin metal layer with the respective insulators to achieve a bond. In one embodiment of the present invention, the metal layer is preferably thin (e.g., less than 500 Å) such that all of the reactive layer is consumed, or reacts with, the insulating layers. In hybrid reactive bonding, bonding is achieved when the surfaces are brought into contact and then heated such that the metal reacts with one or both insulating surfaces.

Furthermore, friction bonding according to the present invention can be used to bond thermoelectric materials and/or superlattice layers to other layers on the thermoelectric device and provide a mechanism for direct attachment of the thermoelectric devices of the present invention to an integrated circuit die or wafer element. Friction bonding techniques of the present invention can include the friction bonding techniques described in U.S. Pat. No. 6,733,605, the entire contents of which are incorporated herein by reference. Friction bonding can, in one embodiment of the present invention, be implemented with intervening reactive layers. In friction bonding, linear motion over a short distance using an ultrasonic transducer provides the friction necessary to produce heating at the surface that will produce the bond. Heating to a high fraction of the melting temperature and then using a friction bonding technique to produce local heating and thereby for instance melting or plastic deformation at the contact surfaces can produce a suitable bond. Heating from one direction and cooling from another side can be used to locally heat to a small area near the contact surfaces. Small amounts of material or thin sheets of material in a perform cut to die or strip size to match the thermoelectric component parts.

Materials in thin sheets or thin film form are used, according to the present invention, to provide for a buffer that protects the thermoelectric superlattice materials during the friction bonding. Materials in thin sheets avoid mechanical damage to the top layers of the thermoelectric materials. The thin layer is selected to form a eutectic that allows friction bonding. In friction bonding, the surfaces of the materials to be bonded can be roughened if necessary to improve the friction and thus the efficacy of forming a friction bond.

Further, diffusion bonding or thermal annealing can be used to bond the thermoelectric devices to a semiconductor device chip.

Bonding can occur between a top header of a thermoelectric devices and a semiconductor device chip by any number of the processes described herein, and can utilize a bonding material to facilitate coupling of the semiconductor device chip to the semiconductor device chip. Regardless of approach, a thermally conductive and mechanically stable connection or bond is preferred between the top header and the semiconductor device chip. Thus, as illustrated above, the present invention can utilize a number of approaches using bonding to facilitate thermal transfer by thermal conduction from one thermoelectric power conversion stage to another. Such techniques and other techniques known in the art can be used to appropriately bond the various stages together. These approaches, according to the present invention, realize high-quality thermal interfacing.

Figure 9:
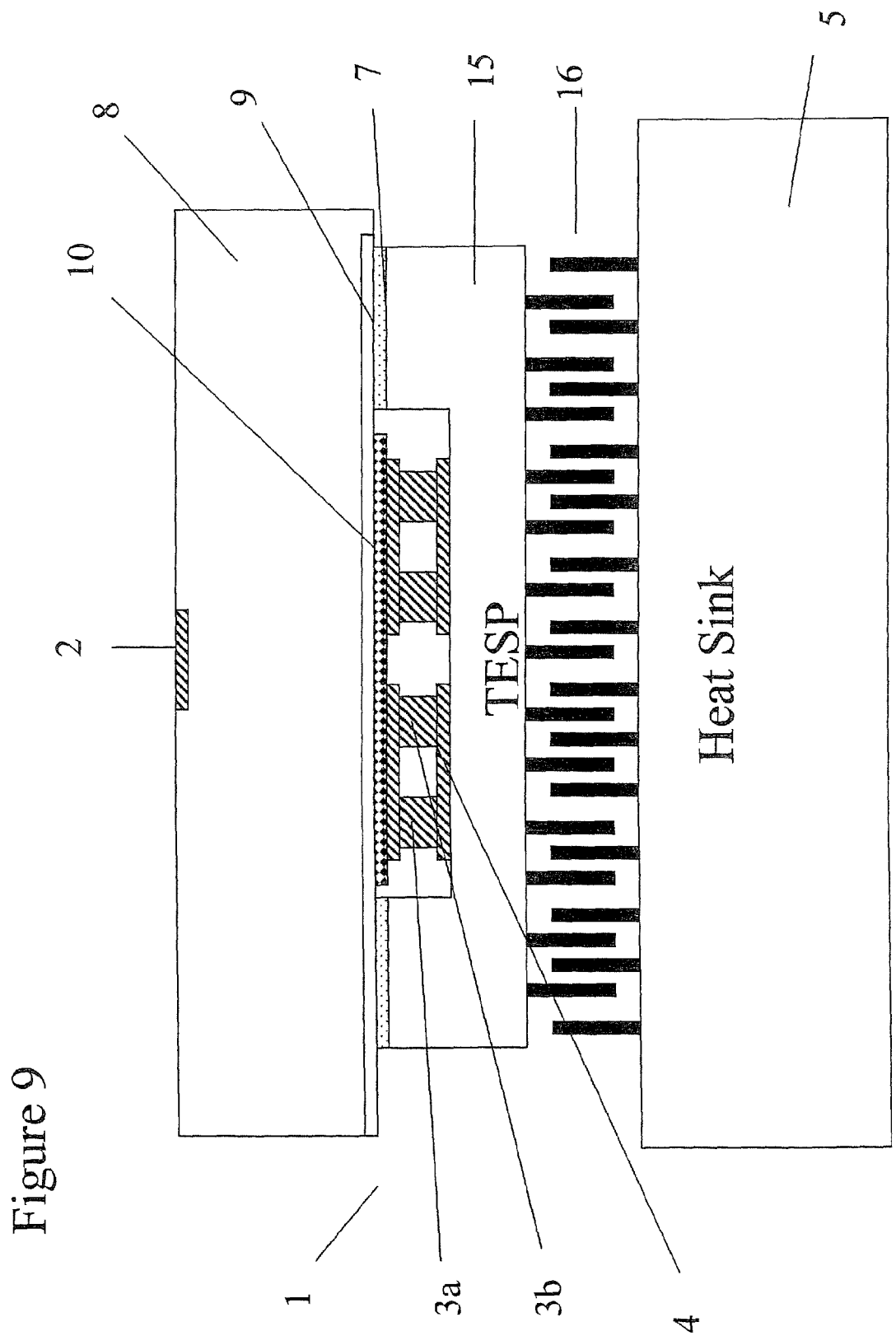
FIG. 9 is a schematic of a thermoelectric device structure according to the present invention using radiant coupling.

Another alternative approach of the present invention for integrating the various thermoelectric conversion stages utilizes radiant thermal energy transfer using Purcell-enhancement cavity transmitter/receiver structures such as those described in the afore-mentioned U.S. Provisional Application No. 60/253,743, the entire contents of which are incorporated herein by reference, entitled "Spontaneous emission enhanced heat transport method and structures for cooling, sensing, and power generation" for heat transfer from one thermoelectric power conversion stage to another. In this approach, the radiant portion, if not the dominant process, plays a substantial role in managing thermal stress by providing less-rigidly-bonded interfaces. Indeed, the present invention can utilize Purcell enhancement from an enhanced density of radiative modes in small-scale structures (similar to enhanced electronic density of states in quantum-confined systems) for enhanced spontaneous emission using patterned μm-size-range, appropriately-spaced, structures for specific temperatures, on the heat spreader. FIG. 9 is a schematic (not to scale) depicting the utilization of radiant coupling in the present invention. Thus, engineered micro-fins 16 as shown in FIG. 9 can also potentially enhance spontaneous radiative heat transport. The engineered micro-fins 16 have μm-size geometries achievable with photolithography a large-area wafers for a cost-effective implementation.

Spontaneous emission enhanced heat transport (SEEHT) may additionally enhance emission at infra-red wavelengths near 300 K. The incorporation of micron or sub-micron size Purcell cavities, will provide for the theoretical maximum radiative emission at peak wavelengths of 10 μm which will enhance heat transport by as much as a factor of 1000 at 300K, leading to a radiative dissipative flux of $\Phi_{SEEHT}$ of 44 W/cm$_2$. Such micron size particles incorporated by impregnation or self-assembly, followed by overgrowth, permit the scope for radiative heat transfer mechanisms to be considerably enhanced. Such particles can further be incorporated in high-thermal conductivity heat spreader such as SiC, AlN, Si, diamond, etc. While not limited to the following theory, the present invention recognizes that of enhanced emission with these Purcell cavity structures can be further enhanced/realized if there is matching of "increased density of states" in emitters with "increased density of states" with receivers/absorbers, i.e., resonant thermal energy transfer. In addition to "resonant thermal energy transfer" by Purcell-cavity effects, other "proximity coupling of radiative infrared modes" can be exploited as well, in the present invention. Utilization of radiation coupling will, according to the present invention, reduce thermal stress, by removing (strong) physical interfacial contacts between various stages. Further, the mechanical alignment of the resonant structures will not be a significant issue, given that the typical size of the inverted couple headers are ~300 μm×300 μm.

For example, according to the present invention, the thermoelectric device structure, especially the thermoelectric devices 3 of the present invention is sized commensurate with the heat-dissipating device 2. The sizing of the thermoelectric devices 3 is facilitated by the thin film thermoelectric device fabrication processes described above. While not limiting the present invention but rather to illustrate various embodiments of the present invention, the heat dissipating device 2 such as shown in FIG. 1 can represent a 200-500 μm×200-500 μm 1-5 W heat dissipater. The thermoelectric device 3 shown in FIG. 1 can represent a 1-3 mm×1-3 mm thermoelectric cooler mounted on the heat sink 5 representing for example a 10 mm×10 mm heat sink or a heat sink with an area from 10 to 30 times the size of the thermoelectric device 3 depending also on the size of the heat dissipating. The thermoelectric device 3 of the present invention principally receives heat flux from the associated heat dissipating device 2 adjacent thereto. While other heat dissipating devices can exist on the semiconductor 8, those heat dissipating devices are thermally managed in one embodiment of the present invention by individually dedicated thermoelectric devices.

Thus, in applications of the thermoelectric device structures to a plurality of heat dissipating devices on for example an integrated circuit chip, the thermoelectric devices and the associated drive current to maintain cooling to the heat dissipating devices can form a map of the power dissipation (i.e., utilization of the processing power on board the chip). Further, by having knowledge of the heat pumped to the ultimate heat sink and the temperature of the ultimate heat sink, the real time temperature of the heat dissipating devices in the chips can be known accurately. Even more, as the processing power changes for an individual heat-dissipating component on the chip, the thermoelectric device can pump away less heat, thereby maintaining for example the microprocessor chip at a near constant temperature, reducing thermal cycling and improving longevity.

Indeed, in one embodiment of the present invention, the thermoelectric devices in the present invention could be operated in reverse to heat the microprocessor chip if needed. Therefore, besides providing a cooling function, the thermoelectric device structures of the present invention can be used more generally to maintain a constant temperature for the heat dissipating device, e.g. an IC chip device regardless of whether the IC chip device needs cooling or heating.

FIG. 10 is a schematic representation of distributed set of thermoelectric coolers 3 on a microprocessor chip or die 20. In one embodiment of the present invention, the thermoelectric devices 3 are coupled for example with neural network intelligence or other suitable analytical processor analysis and control techniques to ascertain a real time map of the processing power being expended, to accommodate changing processing loads, and to maintain a more temperature stable platform for the microprocessor operation. Accordingly, the chip manufacturers can now run individual processors closer to the maximum design temperature, can assess real time the load on each individual processor, and design system control to load share computing processor better among the available number of processors.

Such a capability in one embodiment of the present invention is facilitated by the above-noted thin-film thermoelectric technology which, owing to the small thermal mass of the thermoelectric devices 3, permits the thermoelectric devices 3 to operate with response times indicative of real time heat load changes as compared to response times indicative of a high-thermal mass bulk thermoelectric cooler. Thus, a neural network or an analytical processor 22 of the present invention can monitor the operation of each the thermoelectric devices 3 and together with the physical layout of the thermoelectric devices 3 on the semiconductor material 8 can derive a temperature control model which can, from maps of thermoelectric cooling power, map derive processing power distribution and utilization. Such mapping can serve as feedback to the operating system(s) controlling the distribution of processing jobs to the processors on the integrated circuit boards. Further, such a mapping over time can learn and track any degradations of for example the thermal performance of the interface materials between the device die and the heat sink. Neural network processors are known in the art, as described in U.S. Pat. No. 5,875,347, the entire contents of which are incorporated herein by reference.

Currently, a typical state of the art microprocessor die occupies an area of 100-200 cm$^2$. Further, it is likely in the future that that microprocessor chip areas will increase beyond these levels as increasingly dense transistor integration provides additional functionality and processing power. A thin-film superlattice thermoelectric device can sized be from 1-6 mm$^2$, which would allow multiple spots to be cooled while occupying a relatively small fraction of the total die area. FIG. 10 demonstrates an example of one embodiment of the present invention in which a plurality of 4 mm$^2$ thermoelectric devices 3 are attached to the backside of a 196 mm$^2$ microprocessor die 20.

In this configuration, thermoelectric devices 3 are positioned as needed on the back of the microprocessor die 20 opposite areas of increased heat dissipation, or "hot spots." The location of the hot spots, and the associated thermoelectric device, will be dictated by the particular design and architecture employed for that microprocessor. In this example, power and control signals are routed between the thermoelectric devices 3 using a series electrical connection 24, but alternate methods may include, but are not limited to, parallel connection schemes and separate control lines. Associated with each thermoelectric device 3 is a control circuit 26 which receives signals from the analytical processor 22 (e.g., the above-noted neural net processor) and sets the appropriate current as specified by the signal from the neural net processor 22.

Typically, the neural net processor 22 would be located in a separate device package, not shown, and connected to the thermoelectric devices 3 through the connection pads 28 located at the perimeter of the microprocessor die 20. The control circuit 26 sets the current for the associated thermoelectric device as specified by the signal from the neural network processor 22. The neural net processor 22 can receive inputs from temperature sensors 30 associated with each hot spot. Such temperature sensors 30 can be located on the microprocessor front active side, and on the backside of the processor underneath the thermoelectric device. Additionally, temperature sensors 30a can be included in the thermoelectric device 3. The temperature sensor could be for example a silicon diode, whose dark current is measured to sense the temperature. Output from the temperature sensors 30 and 30a can be used to control the drive to the thermoelectric devices 3.

Using knowledge of the thermal response of the microprocessor die 20, the neural network processor 22 can estimate the power dissipated by the hot spot. In addition, by locating an additional sensor on the heat rejection side of the thermoelectric device, the thermoelectric performance efficiency can be calculated. As such, a mapping unit 22a can map from the drive currents to the thermoelectric devices 3 and from the temperature measurements a thermal profile of the heat generating devices. Such a profile can constitute a power dissipation map for a semiconductor chip.

Further, the control circuit 26 under direction of the neural network processor 22 can equilibrate temperatures across the semiconductor chip by heating and cooling selected ones of the integrated circuits on the semiconductor chip. Indeed, it is possible, according to the present invention, to utilize one of the thermoelectric devices 3 as a power converter converting waste heat from the integrated circuits into power. Thermoelectric power conversion devices are described in the afore-referenced and incorporated U.S. Ser. No. 60/528,479.

FIG. 11 depicts a flow chart illustrating one method of the present invention for controlling a temperature of a heat generating device in a solid medium. At step 1100, heat is extracted heat from the medium into a heat extraction device. At step 1102, heat is dissipated from the heat extraction device into an environment apart from the medium by a heat sink thermally coupled to the heat extraction device. At step 1104, heat is dissipated from the medium into the heat sink by a first thermal interface material thermally coupling the heat sink to the medium.

In steps 1102 and 1104, heat is conducted a first thermal conductance K1 between the heat sink and the heat generating device and through the first thermal interface material that is less than a second thermal conductance K2 between a base of the heat extraction device against the heat sink and the heat sink. In steps 1102 and 1104, heat is conducted under conditions such that the first thermal conductance and the second thermal conductance define a ratio (K1/K2) that ranges from 0.001 to 0.5. In steps 1102 and 1104, heat is conducted under conditions such that the first thermal conductance is higher than a third thermal conductance K3 between the heat sink and a peripheral region surrounding the heat-generating device.

In step 1100, currents through plural heat extracting devices are controlled such that the heat extraction devices operate in at least one of a cooling mode, a heat pump mode, a power conversion mode, and a heat flux sensing mode. As such, inputs from controllers operating the heat extraction devices can be received (e.g., applied voltage, drive current, internal resistance, etc.) as well as temperature measurements of the medium (e.g., the semiconductor 8). From these inputs, a thermal profile of plural heat generating devices in the medium can be mapped, and for example can produce a power dissipation map for integrated circuits on the semiconductor chip 20.

As such, the present inventions have numerous applications in heat-generating environments.

For example in microprocessors, the chip makers are moving from feature sizes that are 130 nanometers wide to 90 nanometers. While the chip makers continue to apply several innovations such as for example hyper pipelined technology to advanced transfer cache to enhanced floating point/multimedia to advanced dynamic execution to high-performance system bus, the chips are facing issues of one or more hot-spots on the microprocessor chips. The hot spots have to be managed, just when conventional thermal management components based on advanced heat-sinks are reaching their limits of heat-dissipation, not only for performance but also for reliability from thermal stress considerations. These thermal management problems are expected to get more severe when there is a move to the 65-nm technology node and down to 45 nm node. The present invention by actively pumping heat from the hot spots without inadvertent shorting of the heat back to the hot spots provides the chip makers future generation cooling capability.

Thermal problems are not unique to desktop and advanced server microprocessor chips. Today's wireless, cellular, and mobile communications devices rely on advanced algorithms, to perform voice, video, audio, and data operations. The front end (e.g., analog-to-digital conversion, bit synchronization, and intelligent demodulation with maximum likelihood sequence estimation) is computationally-intensive. In hostile wireless/mobile environments, as consumers demand for increased data rates, it is increasingly important to apply the most powerful algorithms for wireless communication. Some of the algorithms require several thousand Mips for it to operate optimally. Such computational requirement is usually met with several high-performance Digital Signal Processors (DSPs). However, a multitude of DSPs for an advanced cellular phone design can draw significant power and also lead to thermal management problems in a local area. Another example is the requirement in advanced Code-Division Multiple Access (CDMA) coders to perform certain computations in double-precision integer arithmetic, potentially leading to a significant computational power and resultant hot-spots. Thus, the cooling technology of the present invention is applicable to cool one or more of the DSPs, mounted on a common platform.

Additionally, hot-spot problems are not unique to logic and digital signal processing chips. Hot-spot problems are observed in power electronic building blocks, commonly referred to as PEBB, and other high-power RF communication devices. An example is an Insulated Gate Bipolar Transistor (IGBT) chip which can have one or more hot-spots. In that approach, the design of the heat sink must as a whole accommodate the local hot spots. Instead of designing the entire cooling system to manage the hot-spots, the present invention can cool the hot-spots selectively by the cooling technology described in the present invention. For example, the configuration shown in FIG. 2A is particularly suited for such an IGBT cooling situation, where the thermal impedance on the active side of the silicon chip for heat-removal is significantly low, when contrasted with microprocessor hot-spots, to enable direct, localized, active heat-pumping.

Additionally, the present invention has utility in the cooling of light-emitting circuits such as for example light emitting diodes and solid state lasers.

Numerous modifications and variations of the present invention are possible in light of the above teachings. It is therefore to be understood that within the scope of the appended claims, the invention may be practiced otherwise than as specifically described herein.

The invention claimed is:

1. A system for controlling temperatures on a semiconductor chip, the system comprising:
   heat generating circuits on the semiconductor chip;
   plural thermoelectric devices thermally coupled to the semiconductor chip and configured to extract heat from the heat generating circuits;
   at least one heat sink thermally coupled to the thermoelectric devices and configured to dissipate heat from the thermoelectric devices into an environment apart from the semiconductor chip;
   a thermal interface material configured to thermally couple the at least one heat sink to the semiconductor chip; and
   a processor configured to operate the plural thermoelectric devices in at least one of a cooling mode, a heat pump mode, and a power conversion mode to equilibrate temperatures across the semiconductor chip,
   wherein the processor comprises inputs configured to receive temperature measurements from the semiconductor chip and at least one of operating voltages, currents, and temperatures in the thermoelectric devices, and
   wherein the processor comprises a mapping unit configured to produce from the temperature measurements and the at least one of operating voltages, currents, and temperatures a power dissipation map for integrated circuits on the semiconductor chip, and
   wherein the processor is configured to provide the power dissipation map as feedback to control distribution of processing to the integrated circuits on the semiconductor chip.

2. The system of claim 1, wherein the heat generating circuits comprise at least one of microprocessor circuits, communication circuits, analog-to-digital conversion circuits, bit synchronization circuits, demodulation circuits, light-emitting circuits, and power electronic circuits.

3. The system of claim 1, further comprising:
   said semiconductor chip having a surface in proximity to the heat generating device; and
   said heat extraction device thermally coupled to a side of the semiconductor chip opposite said surface containing the heat generating device.

4. The system of claim 1, further comprising:
   said semiconductor chip having a surface in proximity to the heat generating device; and
   said heat extraction device thermally coupled to said surface containing the heat generating device.

5. The system of claim 1, wherein the processor comprises a neural network processor.

6. An electronic device comprising:
   a semiconductor chip including a plurality of integrated circuits;
   a plurality of thermoelectric devices thermally coupled to and spaced apart on the semiconductor chip; and a processor coupled to the plurality of thermoelectric devices, wherein the processor is configured to
operate the plurality of thermoelectric devices in at least one of a cooling mode, a heat pump mode, and/or a power conversion mode to equilibrate temperatures across the semiconductor chip,
receive temperature measurements from the semiconductor chip,
receive at least one of operating voltages, currents, and/or temperatures in the plurality of thermoelectric devices,
produce from the temperature measurements and the at least one of operating voltages, currents, and temperatures in the plurality of thermoelectric devices a power dissipation map for integrated circuits on the semiconductor chip, and
provide the power dissipation map as feedback to control distribution of
processing to the integrated circuits on the semiconductor chip.

* * * * *

UNITED STATES PATENT AND TRADEMARK OFFICE
CERTIFICATE OF CORRECTION

| | | |
|---|---|---|
| PATENT NO. | : 7,997,087 B2 | Page 1 of 1 |
| APPLICATION NO. | : 12/403866 | |
| DATED | : August 16, 2011 | |
| INVENTOR(S) | : Venkatasubramanian et al. | |

It is certified that error appears in the above-identified patent and that said Letters Patent is hereby corrected as shown below:

Column 5, Line 8: Please correct "FIGS. 7A and 7B are schematic depicting"
to read -- FIGS. 7A and 7B are schematics depicting --

Signed and Sealed this
Thirtieth Day of October, 2012

David J. Kappos
*Director of the United States Patent and Trademark Office*